(12) United States Patent
Mitra

(10) Patent No.: US 7,135,698 B2
(45) Date of Patent: *Nov. 14, 2006

(54) MULTI-SPECTRAL INFRARED SUPER-PIXEL PHOTODETECTOR AND IMAGER

(75) Inventor: Pradip Mitra, Colleyville, TX (US)

(73) Assignee: Lockheed Martin Corporation, Bethesda, MD (US)

( * ) Notice: Subject to any disclaimer, the term of this patent is extended or adjusted under 35 U.S.C. 154(b) by 88 days.

This patent is subject to a terminal disclaimer.

(21) Appl. No.: 10/310,246

(22) Filed: Dec. 5, 2002

(65) Prior Publication Data

US 2004/0108564 A1    Jun. 10, 2004

(51) Int. Cl.
*H01L 29/06* (2006.01)
*H01L 29/04* (2006.01)
*H01L 29/22* (2006.01)
*H01L 29/732* (2006.01)

(52) U.S. Cl. .............. 257/21; 257/53; 257/98; 257/90; 257/184; 250/339.02; 250/338.4; 250/339.1; 250/338.1

(58) Field of Classification Search .......... 257/98, 257/21; 250/338.4, 339.02, 339.01, 338.1
See application file for complete search history.

(56) References Cited

U.S. PATENT DOCUMENTS

| | | | |
|---|---|---|---|
| 3,799,653 A | 3/1974 | Ikeda | 350/164 |
| 3,962,578 A | 6/1976 | Roschen | 260/226 |
| 4,158,133 A | 6/1979 | Spaeth et al. | 250/211 J |
| 4,578,527 A | 3/1986 | Rancourt et al. | 136/256 |
| 4,596,930 A | 6/1986 | Steil et al. | 250/332 |
| 4,620,364 A | 11/1986 | Landis | 29/572 |
| 4,625,389 A | 12/1986 | Readhead | 29/572 |
| 4,639,756 A | 1/1987 | Rosbeck et al. | 357/30 |
| 4,731,640 A | 3/1988 | Bluzer | 357/30 |
| 4,783,594 A | 11/1988 | Schulte et al. | 250/370.08 |
| 4,822,998 A | 4/1989 | Yokota et al. | 250/226 |
| 4,875,084 A | 10/1989 | Tohyama | 357/30 |
| 4,936,653 A | 6/1990 | Schemmel et al. | 350/164 |
| 4,956,555 A | 9/1990 | Woodberry | 250/339 |
| 4,970,567 A | 11/1990 | Ahlgren et al. | 357/30 |

(Continued)

FOREIGN PATENT DOCUMENTS

JP    64-13767 A    1/1989

OTHER PUBLICATIONS

Thomas K. Gaylord, M. G. Moharam, Analysis and Applications of Optical Diffraction by Gratings, *Proceedings of the IEEE*, vol. 73, No. 5, pp. 894-937, (May 1985).

(Continued)

*Primary Examiner*—Douglas W. Owens
*Assistant Examiner*—Samuel A Gebremariam
(74) *Attorney, Agent, or Firm*—Daren C. Davis; James E. Walton

(57) ABSTRACT

A multi-spectral super-pixel photodetector for detecting four or more different bands of infrared radiation is described. The super-pixel photodetector includes two or more sub-pixel photodetectors, each of which includes a diffractive resonant optical cavity that resonates at two or more infrared radiation bands of interest. By detecting infrared radiation at two or more different applied biases and by generating a spectral response curve for each of the sub-pixel photodetectors at each of these biases, the response to each of the individual bands of infrared radiation can be calculated. The response to each band of infrared radiation can be found by deconvolving the response at each bias. The super-pixel photodetector finds use in military and medical imaging applications and can cover a broad portion of the infrared spectrum.

55 Claims, 10 Drawing Sheets

U.S. PATENT DOCUMENTS

| | | | | |
|---|---|---|---|---|
| 5,013,918 | A | 5/1991 | Choi | 250/338.4 |
| 5,023,944 | A | 6/1991 | Bradley | 455/611 |
| 5,047,622 | A | 9/1991 | Chu | 250/211 J |
| 5,075,749 | A | 12/1991 | Chi et al. | 357/30 |
| 5,157,258 | A | 10/1992 | Gunning, III et al. | 250/339 |
| 5,179,283 | A | 1/1993 | Cockrum et al. | 250/352 |
| 5,198,659 | A | 3/1993 | Smith et al. | 250/214.1 |
| 5,243,458 | A | 9/1993 | Hatano et al. | 359/359 |
| 5,261,970 | A | 11/1993 | Landis et al. | 136/259 |
| 5,315,128 | A | 5/1994 | Hunt et al. | 257/16 |
| 5,329,136 | A | 7/1994 | Goossen | 257/17 |
| 5,379,065 | A | 1/1995 | Cutts | 348/269 |
| 5,384,469 | A | 1/1995 | Choi | 257/21 |
| 5,389,797 | A | 2/1995 | Bryan et al. | 257/21 |
| 5,420,681 | A | 5/1995 | Woodruff | 356/326 |
| 5,444,236 | A | 8/1995 | Ludington et al. | 250/208.1 |
| 5,455,421 | A | 10/1995 | Spears | 250/338.4 |
| 5,479,018 | A | 12/1995 | McKee et al. | 250/338.1 |
| 5,479,032 | A | 12/1995 | Forrest et al. | 257/190 |
| 5,485,015 | A | 1/1996 | Choi | 257/21 |
| 5,539,206 | A | 7/1996 | Schimert | 250/338.4 |
| 5,543,628 | A | 8/1996 | Chow et al. | 257/17 |
| 5,552,603 | A | 9/1996 | Stokes | 250/338.4 |
| 5,646,421 | A * | 7/1997 | Liu | 257/21 |
| 5,726,805 | A | 3/1998 | Kaushik et al. | 359/589 |
| 5,773,831 | A | 6/1998 | Brouns | 250/370.08 |
| 5,777,390 | A | 7/1998 | Berger et al. | 257/749 |
| 5,818,066 | A | 10/1998 | Duboz | 257/21 |
| 6,133,571 | A | 10/2000 | Dodd | 250/338.4 |
| 6,157,042 | A | 12/2000 | Dodd | 257/21 |
| 6,180,990 | B1 | 1/2001 | Claiborne et al. | 257/440 |
| 6,355,939 | B1 | 3/2002 | Dodd | 257/21 |
| 6,897,447 | B1 * | 5/2005 | Mitra | 250/339.02 |

OTHER PUBLICATIONS

T. Wipiejewski, K. Panzlaff, K. J. Ebeling, Resonant wavelength selective photodetectors, *Microelectronic Engineering*, 0167-9317/92, pp. 223-229, Elsevier Scient Publishers B. V. (1992).

H. C. Liu, Jianmeng Li, J. R. Thompson, Z. R. Wasilewski, M. Buchanan and J. G. Simmons, *Multicolor Voltage-Tunable Quantum-Well Infrared Photodetector*, IEEE Electron Device Letters, vol. 14, No. 12, EDLEDZ (ISSN 0741-3106), 4 pages (Dec. 1993).

Gregory E. Terrie, *Applications of Hyperspectral Data in Coastal Marine Environments*, Thesis, Naval Research Laboratory, Stennis Space Center, MS, 59 pages (Nov. 17, 1995).

R. Basedow, P. Silverglate, W. Rappoport, R. Rockwell, D. Rosenberg, *HYDICE Instrument Design and Its Application to Planetary Instruments*, Hughes Danbury Optical Systems, Inc., CT, Abstract Only—1 page (1993).

Peter Silvergate, Ker Li Shu, Dennis Preston, John Stein, Frank Sileo, *Concepts for spaceborne hyperspectral imagery using prism spectrometers*, SPIE, vol. 2267, cover page and pp. 112-120 (Jul. 1994).

C. C. Barron, C. J. Mahon, B. J. Thibeault, G. Wang, W. Jiang, L. A. Coldren, J. E. Bowers, Resonant-cavity-enhanced pin photodetector with 17 GHz bandwidth-efficienty product, *Electronics Letters*, vol. 30, 3 pages (Oct. 13, 1994).

P. C. Pinet, *Spectroscopic Imaging of Solid Planetary Surfaces*, Astronomical Society of the Pacific, ASP Conference Series, vol. 71, pp. 294-297 (1995).

Yudi Adityawarman, R. A. Schowengerdt, *Performance Modeling of Hyperspectral Imaging Sensors for Atmospheric Studies*, Final Technical Report, Naval Research Laboratory, Washington, D.C., pp. 1-25 (Sep. 1994).

M. J. Dahlin, A. W. Hoffman, J. L. West, R. West, J. Santana, S. Ortega, S. Byers, D. Thiede, S. Bailey, E. Herrin, M. Levy, R. Parlato, N. Maassen, Development of High Speed IR Sensor Chip Technologies, *Infrared Readout Electronics III Symposium*, SPIE vol. 2745, pp. 22-39 (Apr. 1996).

O. Saint-Pé, O. Donnadieu, R. Davancens, D. Charlton, A. Menardi, M. Fabbricotti, B. Harnisch, R. Meynart, B. Kunkel, Development of a 2-D Array for 1 to 2.35 pm Hyperspectral Imager, *Infrared Detectors for Remote Sensing: Physics, Materials and Devices Symposium*, SPIE vol. 2816, pp. 138-149 (Aug. 1996).

N. S. Gluck, R. B. Bailey, R. de la Rosa, R. L. Hall, Two-color imaging by the use of patterned optical filters bonded to focal-plane-array detectors, *Applied Optics*, vol. 35, No. 28, pp. 5520-5523 (Oct. 1, 1996).

Aleksandar Zavaljevski, Atam P. Dhawan, David J. Keich, James Riddell, III, Adaptive multilevel classification and detection in multipsectral images, *Optical Engineering*, pp. 2884-2893 (Oct. 1996).

Scott Briles, *Evaluation of Onboard Hyperspectral-Image Compression Techniques for a Parallel Push-Broom Sensor*, SPIE vol. 2758, pp. 332-341 (1996).

Charles T. Willoughby, Jay Marmo, Mark A. Folkman, *Hyperspectral Imaging Payload For The NASA Small Satellite Technology Initiative Program*, IEEE, pp. 67-79 (1996).

Paul L. McCarley, Mark A. Massie, Christopher R. Baxter, Buu L. Huynh, *NeuroSeek Dual-Color Image Processing Infrared Focal Plane Array*, SPIE, vol. 3360, cover page and pp. 13-27 (Apr. 1998).

Meimei Z. Tidrow, *Multicolor Quantum Well Infrared Photodetectors*, Army Research Lab., Adelphi, MD, 11 pages (1998).

Meimei Z. Tidrow, *Recent Progress on Multicolor Quantum Well Infrared Photodetectors*, Proceedings of the Eighth International Conference on Narrow Gap Semiconductors, Shanghai, China; World Scientific, (1998)—Abstract Only, 2 pages.

* cited by examiner

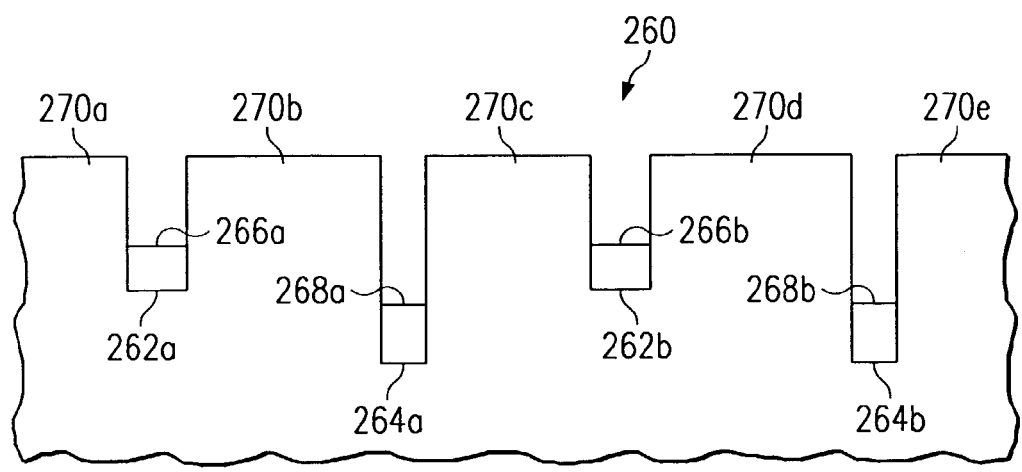
FIG. 2d
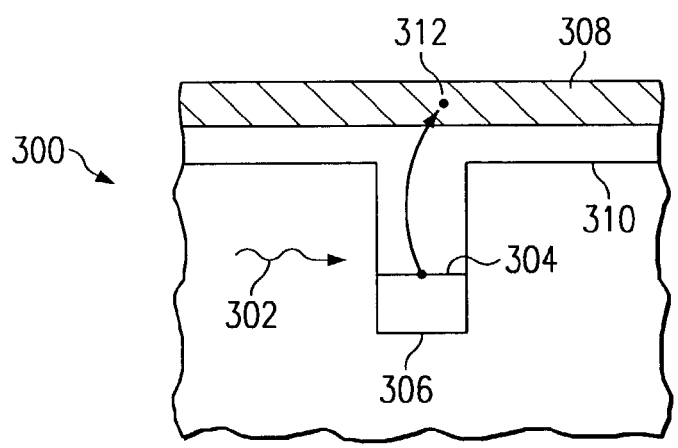
FIG. 3a
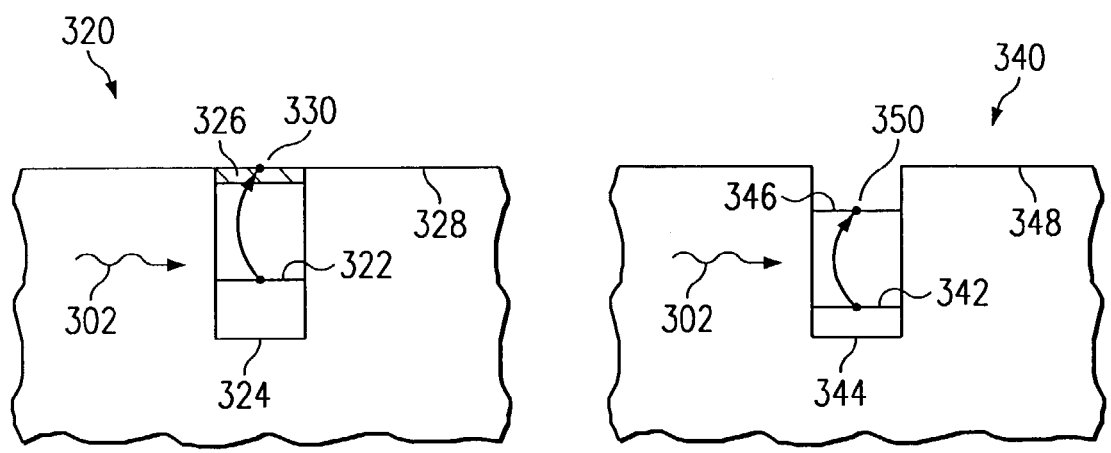
FIG. 3b
FIG. 3c

MULTI-SPECTRAL INFRARED SUPER-PIXEL PHOTODETECTOR AND IMAGER

FIELD OF THE INVENTION

The present invention relates to a photodetector sensitive to infrared radiation. In particular, the present invention provides for a super-pixel photodetector and a staring array imager including two or more diffractive resonant optical cavity sub-pixel photodetectors, the super-pixel photodetector sensitive to radiation in at least four different infrared wavelength bands, the relative photoresponse being bias controlled.

BACKGROUND OF THE INVENTION

In the field of infrared (IR) imaging, the current objective is to provide high pixel count imagers at low cost with high performance. InSb, HgCdTe and quantum well infrared photodetector (QWIP) technologies have demonstrated high performance large area imagers. Each of these technologies has various strengths and weaknesses. InSb photodetectors offer high performance, ease of fabrication, and operation at wavelengths of less than 5 µm, but must be cooled to approximately 80 K. HgCdTe photodetectors can be designed to operate in the important long wavelength IR (LWIR) band corresponding to a wavelength range of 8 to 12 µm and the middle wavelength IR (MWIR) band corresponding to a wavelength range of 3 to 5 µm. HgCdTe photodetectors require very tight tolerances in material and fabrication uniformity, especially in the LWIR band, to ensure high performance. QWIP photodetectors have been demonstrated in both the MWIR and LWIR band. Because of the maturity of the GaAs/AlGaAs material system used in QWIP photodetectors, tight tolerances in both material and fabrication uniformity are readily obtained. QWIP photodetector sensitivity is generally lower than that achieved by InSb or HgCdTe photodetectors in their respective wavelength bands.

Multi-spectral detection is increasingly desirable as a method to increase the probability of detection under various environments. As an example, objects that are only slightly above room temperature, such as a person, are most easily detected in the LWIR corresponding to the peak IR radiation emission band for near room temperature objects. In contrast, a hot object, such as an automobile exhaust pipe, can be readily detected in the MWIR corresponding to the peak IR radiation emission band for objects having a temperature of more than 600 K. Thus, a system that provides high performance with either of these objects should be sensitive to both wavelength bands.

In military applications, it is possible to camouflage an object such that the object emits little radiation in a particular portion of the IR spectrum. A multi-spectral photodetector with appropriately selected sensing wavelengths therefore provides a means of detecting objects that have been camouflaged in this manner.

Additional applications may use multi-spectral photodetectors for discriminating one object from another. As two objects at different temperatures emit different amounts of IR radiation at different wavelengths, a multi-spectral photodetector can more readily discriminate between the objects. As an example, two identical cars may be parked next to each other. If one has recently been driven while the second has not been operated for several hours, a multi-spectral detector could readily sense the subtle differences in emissivities corresponding to temperature differences of less than a degree.

Medical applications can also benefit from the additional discrimination that can be achieved with a multi-spectral photodetector. In particular, detection of cancerous lesions using infrared imaging has shown great promise. The sensitivity of such systems can be increased by imaging at two or more wavelengths to remove any artifacts in the image, such as might be caused by birthmarks, scars, tattoos, etc. The use of two or more wavelengths will also increase sensitivity as smaller temperature differences can be detected.

Sensitivity in these applications can be increased still further by using multi-spectral photodetectors that are sensitive to four or more wavelengths. An imager produced using such multi-spectral photodetectors is effectively an imaging spectrometer. Imaging spectrometers have additional applications including earth imaging and remote sensing. An earth imaging application with an imaging spectrometer can be used to readily detect crop diseases. A military application that would benefit from an imaging spectrometer is mine detection in which earth, disturbed by the placement of a mine, can be readily sensed.

Conventional IR detector technologies have proven difficult to adapt to this current demand for multi-spectral detection. As noted above, high performance single band detectors and imaging arrays have been demonstrated using HgCdTe, InSb and QWIP technologies. Of these, multi-spectral detection has been demonstrated only with the HgCdTe and QWIP technologies. The multi-spectral HgCdTe photodetectors demonstrated to date have excellent performance, but the arrays suffer significantly from both non-uniformity in the HgCdTe material and the fabrication process. While multi-spectral QWIP photodetectors do not place as stringent requirements upon the starting material, the fabrication process has similarly proven to be challenging. Further, both IR detector technologies have suffered from reduced performance in multi-spectral photodetectors in comparison to single band performance. Lastly, operation in more than one wavelength band has generally required at least one additional electrical connection between the photodetector and the external electronics for each wavelength band.

A hyper-spectral IR radiation detector using QWIP photodetector technology is disclosed in U.S. Pat. No. 6,180,990 to Claiborne et al. The disclosed hyper-spectral IR radiation detector uses a linear array of QWIP photodetectors, each absorbing a different wavelength band. To collect information in each of the wavelength bands, the disclosed hyper-spectral IR radiation detector must be scanned across the target. This detection method suffers from possible movement by the target resulting in a loss of spatial registration. Further, as a potentially large number of QWIP photodetectors must be scanned across the image, the resultant information will suffer from a loss of temporal registration as well.

In view of the desirability of multi-spectral IR photodetectors for applications such as an imaging spectrometer, there exists a need for a design that places fewer and/or less stringent requirements upon the starting material and/or the fabrication process. Such photodetectors should also be highly producible. It is also desirable to develop a photodetector technology that requires fewer electrical connections between each photodetector and the external electronics. Furthermore, it is desirable to readily change from detecting in one group of wavelength bands to another group of wavelength bands, even alternating consecutive images between two or more groups of wavelength bands.

SUMMARY OF THE INVENTION

A first embodiment of the present invention comprises a multi-spectral IR super-pixel photodetector including a plurality of sub-pixel photodetectors. Each of the sub-pixel photodetectors comprises a plurality of elongate IR absorbing elements for absorbing at least two bands of IR radiation. Each of the plurality of elements has two opposing surfaces, with the IR radiation incident upon the first of these surfaces. A top contact including a plurality of electrically interconnected strips is in electrical contact with and extends along the first surfaces of the plurality of elements. A bottom contact is in electrical contact with the second surfaces of the plurality of elements. The top and bottom contacts provide for current flow through the plurality of elements. The sub-pixel photodetector also includes a reflector for the IR radiation on an opposite surface of the bottom contact from the plurality of elements. A ratio between a photoresponse to each of the bands of IR radiation in each sub-pixel is a function of an external bias applied between the top and bottom contacts. The plurality of elements, the top and bottom contacts and the reflector comprise a diffractive resonant optical cavity (DROC) for the two or more bands of IR radiation. This is in contrast to previous DROC designs that required multiple cavity designs to support multiple bands of IR radiation, such as the designs found in U.S. Pat. No. 6,452,187. Lastly, the DROC for a first sub-pixel photodetector is different from the DROC for a second sub-pixel photodetector within a super-pixel photodetector.

Another embodiment of the present invention is a method for detecting multiple bands of IR radiation. The method first includes forming a super-pixel photodetector in accordance with the first embodiment. Next, a blackbody spectral response curve of the super-pixel photodetector is generated at several different applied biases. The number of applied biases equals the number of bands of IR radiation divided by the number of sub-pixel photodetectors within the super-pixel photodetector. For example, if the number of intrinsic absorption bands in the material super-pixel photodetector responds to twelve bands of IR radiation and has four sub-pixel photodetectors within the super-pixel photodetector, three different applied biases must be used. IR radiation is then detected at each of the different applied biases, thereby creating a corresponding number of signals. Lastly, the signals are deconvolved using the generated spectral response curves, thereby creating a band signal corresponding to each of the bands of IR radiation.

In yet another embodiment of the present invention, a multi-spectral IR imager includes an array of super-pixel photodetectors in accordance with the first embodiment with four sub-pixel photodetectors per super-pixel photodetector. Each of the sub-pixel photodetectors absorbs three bands of IR radiation. The DROC for each of the four sub-pixel photodetectors within a super-pixel photodetector is different, thereby allowing each super-pixel photodetector to absorb twelve different bands of IR radiation. The multi-spectral IR imager further includes a readout integrated circuit that can apply three external biases between the top and the bottom contacts of each of the sub-pixel photodetectors. These applied biases create a corresponding photo-response of each of the sub-pixel photodetectors within the array of super-pixel photodetectors. The readout integrated circuit also multiplexes the photoresponse of each of the sub-pixel photodetectors within the array of super-pixel photodetectors at each of the three applied biases.

In each embodiment, the bias voltage is applied across the IR absorbing elements via the top and bottom contacts such that a resulting current flow is along an axis of the IR absorbing elements. A magnitude of the resulting current flow is indicative of the quantity of IR radiation absorbed by the IR absorbing elements. Changing the magnitude and/or polarity of the applied bias results in non-linear changes in the response magnitudes of each band of IR radiation. Therefore, the relative magnitude of the IR radiation detected in each band can be established by changing the applied bias and through using external signal processing circuitry. The number of individual bands being sensed within a sub-pixel photodetector must be less than or equal to the number of different applied biases to allow establishing signals that are proportional to each individual band of IR radiation absorbed by the sub-pixel photodetector.

As each sub-pixel photodetector responds to a different group of bands, there would appear to be an issue with spatial registration between the different groups of bands. However, as the super-pixel photodetector will typically be used in a staring imaging system, the optics of the staring imaging system must be considered. For an f/#2 imaging system operating in the LWIR, the resultant blur circle is 39–59 µm. Thus, for a 50 µm×50 µm super-pixel photodetector, the different groups of bands will be spatially registered over most of the LWIR wavelength range.

Photodetectors comprising a single multi-spectral IR super-pixel photodetector, a one-dimensional line array of super-pixel photodetectors and a two-dimensional area array of super-pixel photodetectors are envisioned. The two-dimensional array of super-pixel photodetectors is readily amenable to forming imagers for various staring applications. Depending upon the desired bands of IR radiation, a number of different material systems may be used to form the IR absorbing elements.

BRIEF DESCRIPTION OF THE DRAWINGS

The present invention is described in reference to the following Detailed Description and the drawings in which:

FIGS. 2a–d are energy band diagrams for different starting materials for use in the present invention, FIGS. 3a–c are IR absorption mechanisms for different starting materials for use in the present invention.

DETAILED DESCRIPTION OF THE PREFERRED EMBODIMENTS

Various embodiments of the present invention are described in detail with reference to the drawings with corresponding elements having corresponding numbers throughout the drawings. While the following description will generally discuss a multi-spectral IR super-pixel photodetector absorbing two IR bands per sub-pixel photodetector, altering the design of the IR absorbing layer can lead to absorbing three or more IR wavelength bands in each sub-pixel photodetector.

Figure 1:
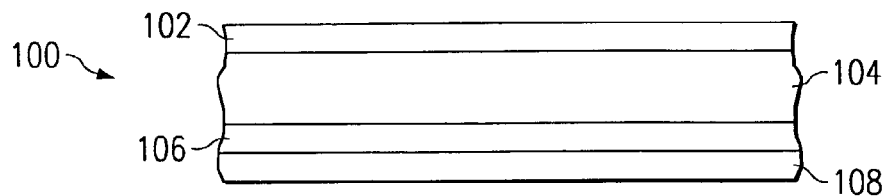
FIG. 1 is a cross-sectional view of the starting material for first, second and third embodiments of the present invention.

FIG. 1 is a cross-sectional view of the starting material 100 used in fabricating a multi-spectral IR super-pixel photodetector in accordance with the three described embodiments. The starting material 100 includes a series of laminae formed in succession. A top contact 102 is formed of doped semiconductor material. The top contact 102 is preferably heavily doped to reduce contact resistance and has a thickness of approximately 0.2 to 0.5 μm. An IR absorbing layer 104 is formed of semiconductor material that absorbs IR radiation in first and second IR wavelength bands. The IR absorbing layer 104 preferably has a thickness of between 0.4 and 1.0 μm. A bottom contact 106 is formed of doped semiconductor material. The bottom contact 106 is preferably heavily doped to reduce contact resistance and has a thickness of approximately 0.2 to 0.5 μm. A reflector 108 that is highly reflective to both the first and second bands of IR radiation completes the starting material 100. The reflector 108 is preferably metallic and formed of gold or an alloy of two or more metals, such as chromium and gold. The thickness of the reflector 108 is preferably between 0.1 and 0.25 μm. Alternatively, the reflector 108 can be formed of a Bragg reflector designed to be highly reflective to both the first and second bands of IR radiation. Further, the reflector 108 is preferably planar.

The IR absorbing layer 104 can be formed of several different materials and material systems, only one of which will be examined in detail hereinafter. The preferred material comprises multiple quantum wells (MQWs) formed of GaAs and its alloys such as AlGaAs and InGaAs. QWIPs and Enhanced QWIPs (EQWIPs) have demonstrated high levels of performance using GaAs/AlGaAs MQW IR absorbing layers.

Figure 2A:
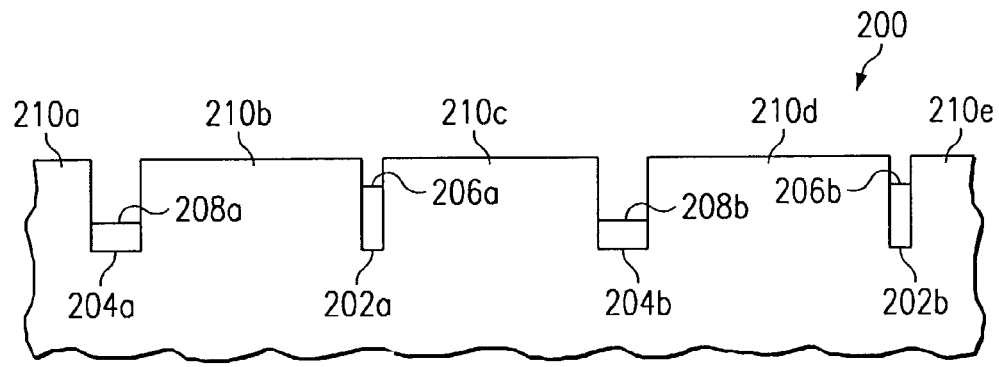

FIGS. 2a through 2d illustrate the conduction band energy diagram for four different possible MQW-based IR absorbing materials. FIG. 2a illustrates MQW material 200 having isolated or uncoupled quantum wells 202a,b and 204a,b. Isolated or uncoupled means that the ground state energy levels 206a,b in quantum wells 202a,b do not interact with the ground state energy levels 208a,b of quantum wells 204a,b. This is accomplished by having relatively thick barriers 210a–e. Typical barrier widths are 300–500 Å. The quantum wells 202a,b and 204a,b preferably comprise GaAs and will have a width of 20–50 Å depending upon the IR radiation band to be absorbed. As illustrated in FIG. 2a, quantum wells 202a,b are narrower than quantum wells 204a,b, and thus absorb the longer of the two IR radiation wavelength bands. The different width quantum wells need not be interleaved as illustrated in FIG. 2a, but may form two groups of equal width quantum wells. If two groups of equal width quantum wells are used rather than interleaved quantum well widths, it is preferable that the quantum wells for absorbing the shorter IR radiation wavelength band be placed closer to the reflector 108. The barriers 210a–e preferably comprise $Al_xGa_{1-x}As$, where $0.1 \leq X \leq 0.6$ depending upon the IR radiation bands to be absorbed.

Figure 2B:
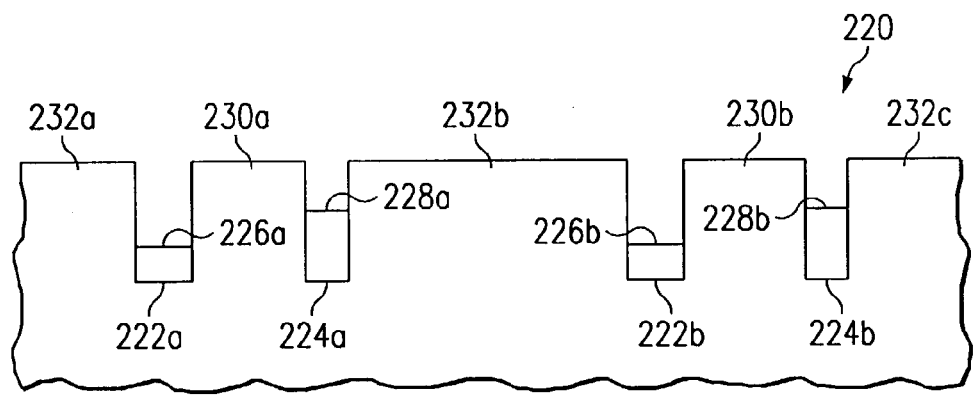

A second MQW material 220 design is illustrated in FIG. 2b. In contrast to the isolated or uncoupled quantum wells in MQW material 200, the quantum wells 222a,b and 224a,b are weakly coupled. In this case, the ground state energy levels 226a,b of quantum wells 222a,b slightly interact with the ground state energy levels 228a,b of quantum wells 224a,b, causing each to broaden. The weakly coupled quantum wells are separated by narrow barriers 230a,b, while each pair of weakly coupled quantum wells is separated by a broad barrier 232a–c. Preferred narrow barrier widths are 100–200 Å while the preferred broad barrier widths are 300–500 Å. As with MQW material 200, the quantum wells within each coupled pair are of different widths. As illustrated in FIG. 2b, quantum wells 222a,b are broader than quantum wells 224a,b and will therefore absorb the shorter of the two IR radiation wavelength bands. The quantum wells 222a,b and 224a,b preferably comprise GaAs and will have a width of 20–50 Å depending upon the IR radiation bands to be absorbed. In addition, like MQW material 200, the barriers 230a,b and 232a–c will comprise $Al_xGa_{1-x}As$, where $0.1 \leq X \leq 0.6$ depending upon the IR radiation bands to be absorbed.

Figure 2C:
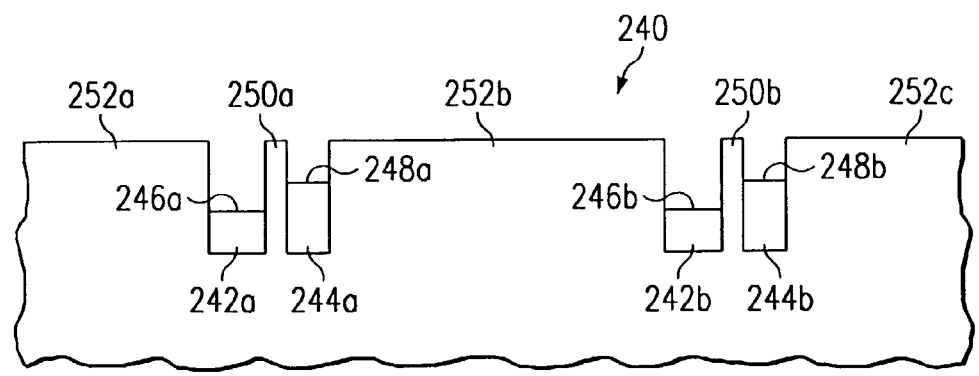

FIG. 2c illustrates strongly coupled MQW material 240. The ground state energy levels 246a,b of quantum wells 242a,b strongly interact with the ground state energy levels 248a,b of quantum wells 244a,b, causing each to significantly broaden. Under the appropriate applied bias, the ground state energy levels 246a,b can align with the ground state energy levels 248a,b leading to potentially higher IR absorption and dark current. The coupled quantum wells are separated by narrow barriers 250a,b, while each pair of coupled quantum wells is separated by a broad barrier 252a–c. Preferred narrow barrier widths are 20–75 Å while the preferred broad barrier widths are 300–500 Å. As with MQW material 200, the quantum wells within each coupled pair are of different widths. As illustrated in FIG. 2c, quantum wells 242a,b are broader than quantum wells 244a,b and will therefore absorb the shorter of the two IR radiation wavelength bands. The quantum wells 242a,b and 244a,b preferably comprise GaAs and will have a width of 20–50 Å depending upon the IR radiation bands to be absorbed. In addition, like MQW material 200, the barriers 250a,b and 252a–c will comprise $Al_xGa_{1-x}As$, where $0.1 \leq X \leq 0.6$ depending upon the IR radiation bands to be absorbed.

A fourth type of MQW material 260 suitable for absorbing IR radiation is shown in FIG. 2d. This MQW material 260 uses quantum wells 262a,b formed of GaAs, while quantum wells 264a,b are formed of InGaAs. By using InGaAs as the quantum well material, the ground state energy levels 268a,b of quantum wells 264a,b are lower, allowing the absorption of shorter IR wavelengths than the ground state energy levels 266a,b of quantum wells 262a,b. As with MQW material 200, the quantum wells 262a,b and 264a,b can be either interleaved or grouped. The quantum wells 264a,b comprise $In_yGa_{1-y}As$, where $0.0 \leq Y \leq 0.15$ depending upon the IR radiation bands to be absorbed. The barriers 270a–e will preferably have a thickness of 300–500 Å and will comprise $Al_xGa_{1-x}As$, where $0.1 \leq X \leq 0.6$ depending upon the IR radiation bands to be absorbed.

A number of IR absorption mechanisms are feasible with the above four MQW material types. First is a bound to continuum (BTC) type material 300 as shown in FIG. 3a. In BTC type material, the IR radiation is absorbed when an incident photon 302 excites a ground state electron 304 from a GaAs quantum well 306 into the energy continuum 308 above the AlGaAs barrier energy 310. Due to quantum mechanical selection rules, the incident photon 302 must have an electric field component that is normal to the plane of the quantum well 306 if the incident photon 302 is to be absorbed by lattice matched MQW material 200, 220, 240 and 260. By applying an electric field across the BTC type material 300, the excited electron 312 is swept from the IR absorbing layer 104, collected in either the top or bottom contact 102, 106 depending upon the applied polarity and detected in an external circuit. For absorption in the MWIR, the barriers of the BTC type material 300 will preferably have an aluminum content X in the range of 0.4 to 0.6. For absorption in the LWIR, the barriers of the BTC type material 300 will preferably have an aluminum content X in the range of 0.1 to 0.4.

A second IR absorption configuration is bound to quasi-continuum (BTQC) type material 320 and is illustrated in FIG. 3b. In BTQC material 320, the IR radiation is absorbed when an incident photon 302 excites a ground state electron 322 from a quantum well 324 into an energy state 326 approximately equal to the barrier energy 328. By applying an electric field across the BTQC type material 320, the excited electron 330 is swept from the IR absorbing layer 104, collected in either the top or bottom contact 102, 106 and detected in an external circuit. Example material parameters for the BTQC type material 320 are quite similar to the BTC type material 300, with the exception of the quantum well thickness. A slightly wider quantum well 324, having a thickness of 25–50 Å, is required to create the energy state that is approximately equal to the barrier energy 328. Like the BTC type material 300, the BTQC type material 320 IR absorption wavelengths are typically controlled by the specific quantum well thickness and barrier composition.

A third IR absorption configuration illustrated in FIG. 3c, uses two bound energy states, and thus is known as bound to bound (BTB) type material 340. In BTB type material, the IR radiation is absorbed when an incident photon 302 excites a ground state electron 342 from a quantum well 344 into a bound energy state 346 less than the AlGaAs barrier energy 348. By applying an electric field across the BTB type material 340, the excited electron 350 tunnels through a portion of the adjacent barrier and is swept from the IR absorbing layer 104, collected in either the top or bottom contact 102, 106 and detected in an external circuit. Example material parameters for the BTB type material 340 are generally similar to the BTC type material 300, with the exception of the quantum well width. The quantum well width must be greater than that of similar BTC type material 300 as two bound energy states must be created. Typical quantum well widths in BTB material 340 range from 30 to 60 Å.

In any of the BTC, the BTQC and the BTB type materials 300, 320, 340, the quantum well can alternatively be $In_YGa_{1-Y}As$, wherein $0.0 \leq Y \leq 0.15$. A further alternative is the use of a material system such as InGaAs/InAlAs, InGaAs/InP or various other III–V or II–VI based material systems. Yet another alternative is the use of p-type MQW material in which a ground state energy hole is excited during absorption of the incident photon. It should be noted that p-type MQW material places no requirements on the polarization of the photon's electric field. Molecular beam epitaxy (MBE) or metal-organic chemical vapor deposition (MOCVD) can be used to form the various type IR absorbing materials from the different III–V and II–VI material systems.

The conduction band energy diagrams of FIGS. 2a–d illustrate only two quantum well widths, thus leading to two different absorption bands. For a dual-band IR sub-pixel photodetector, the designs illustrated in FIGS. 2a–d are sufficient. However, for a multi-spectral IR sub-pixel photodetector that absorbs in three different bands, three different quantum well widths would be required. Four different bands would require four different quantum well widths, etc. Due to the very precise nature of MBE and MOCVD, forming IR absorbing material with quantum well widths that differ by 5 Å is possible. Therefore, an IR absorbing material for a triple-band IR sub-pixel photodetector could have quantum well widths of 25 Å, 30 Å and 38 Å.

Figure 4:
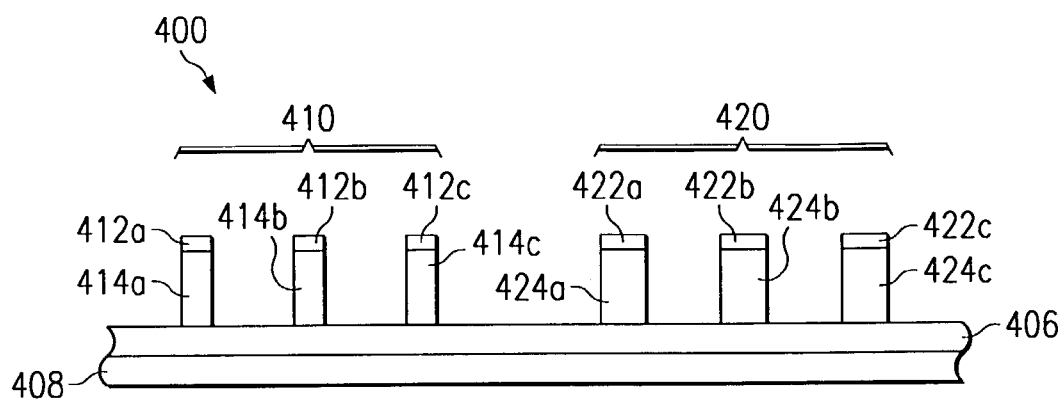
FIG. 4 is a cross-sectional view of the first embodiment of the present invention.
Figure 6:
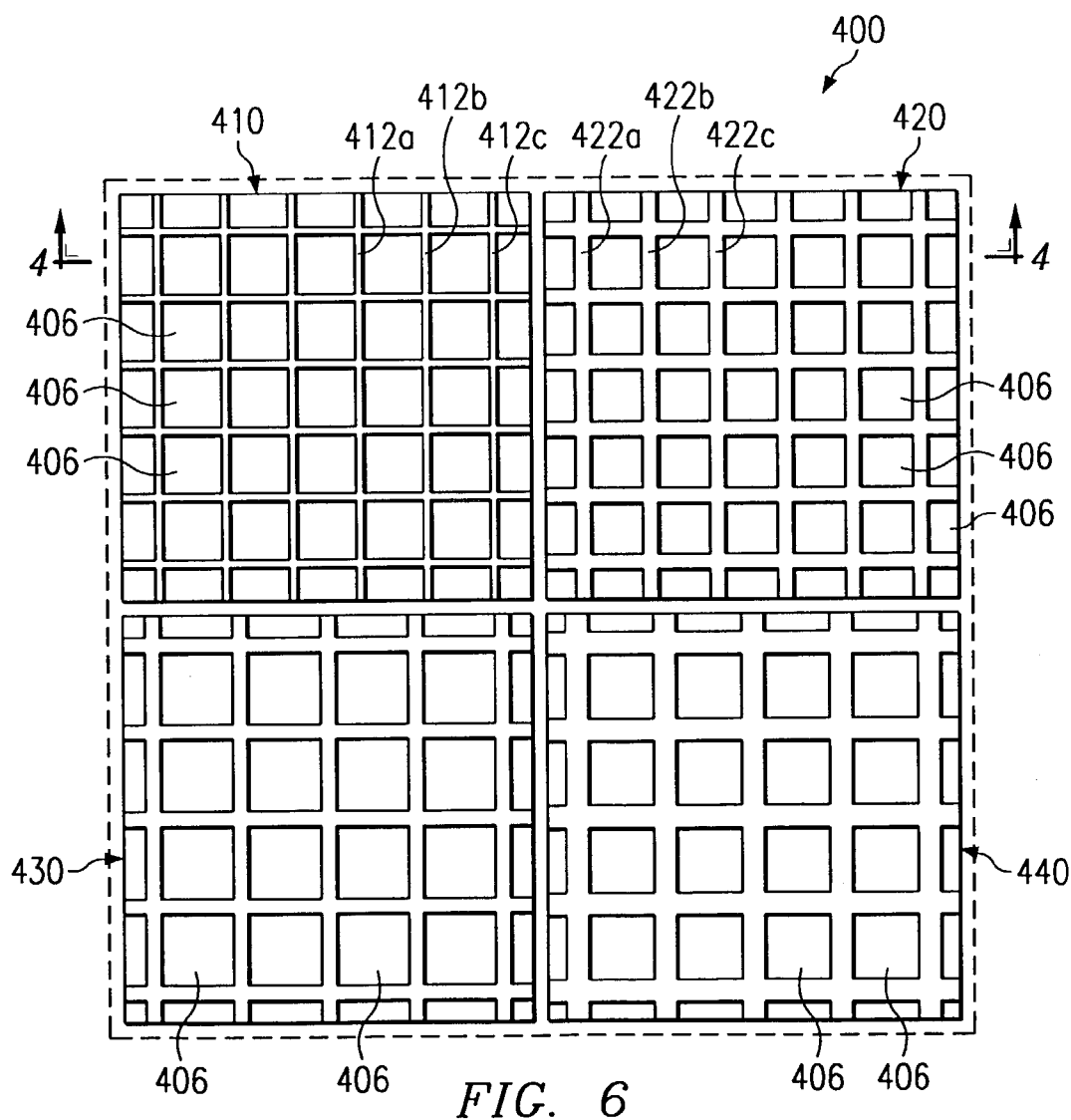
FIG. 6 is a top down view of the first embodiment of the present invention.
Figure 5:
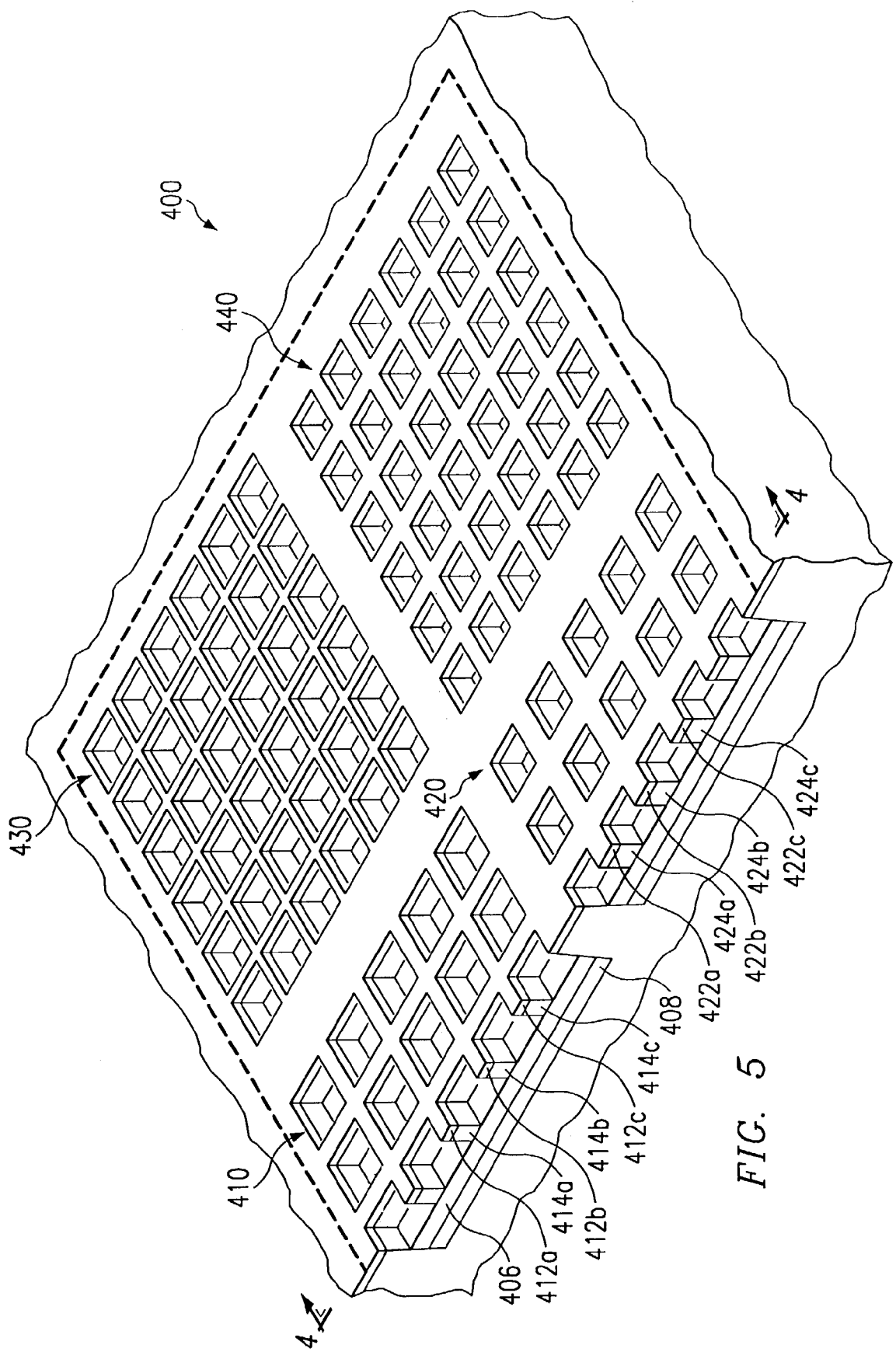
FIG. 5 is a perspective view of the first embodiment of the present invention.

A multi-spectral IR super-pixel photodetector 400 according to a first embodiment of the present invention is illustrated in FIG. 4 and can be formed from any of the various starting materials described above. The first embodiment is formed through a process comprising an etching step and a metal deposition step thereby fabricating the multi-spectral IR super-pixel photodetector 400. The multi-spectral IR super-pixel photodetector 400 includes four dual-band IR sub-pixel photodetectors 410, 420, 430, 440, of which only dual-band IR sub-pixel photodetectors 410 and 420 are visible in cross-sectional FIG. 4. The etch process removes a portion of the top contact 102 (FIG. 1) and the IR absorbing layer 104 down to the bottom contact 406, resulting in top contact elements 412a–c and 422a–c, and elongate IR absorbing layer elements 414a–c and 424a–c. The resulting width of the top contact elements 412a–c and 422a–c and the elongate IR absorbing layer elements 414a–c and 424a–c are preferably from 0.6 to 1.6 μm depending upon the desired IR wavelength bands. The width of the top contact elements 412a–c and the elongate IR absorbing elements 414a–c is less than the width of the top contact elements 422a–c and the elongate IR absorbing elements 424a–c. This results in dual-band IR sub-pixel 410 resonating at different IR wavelengths than dual-band IR sub-pixel 420. This IR wavelength resonance will be described in detail below. Note that while top contact elements 412a–c and 422a–c appear to be separate in FIG. 4, top contact elements 412a–c and 422a–c are electrically interconnected strips as shown in FIGS. 5 and 6. The reflector 408 is deposited on the side of the bottom contact 406 opposite the etched portion. The fabrication process need not be conducted in this sequence.

While the above etching processes may appear difficult, two different possible approaches to the processes have been developed. Both processes are based upon the difference in etch rates of different materials. In the simplest solution, the etch rate of the bottom contact 406 is significantly lower than the etch rate of the IR absorbing layer 104. In this case, the etch can be timed to ensure the IR absorbing layer 104 is completely removed with little fear of removing much of the bottom contact 406. The second solution could be used in the case where the etch rate between the IR absorbing layer 104 and the bottom contact 406 is similar. In this case, an etch stop layer (not illustrated) is placed between the IR absorbing layer 104 and the bottom contact 406. The selected etch stop layer material preferably has an etch rate that is significantly lower than the etch rate of the IR absorbing layer 104. As an example, the etch rate of $Al_{0.6}Ga_{0.4}As$ is significantly less than the etch rate of $Al_{0.3}Ga_{0.7}As$. As the IR absorbing layer 104 may comprise $GaAs/Al_{0.3}Ga_{0.7}As$ MQW material, an etch stop comprised of $Al_{0.6}Ga_{0.4}As$ is feasible.

Two alternative structures are also possible. As seen in FIG. 4, the etching is stopped at the interface between the IR absorbing layer 104 and the bottom contact 406. The first alternative, not illustrated, is to etch partially into the bottom contact 406. The second alternative, also not illustrated, is to etch completely through the bottom contact 406 to the reflector 408. These two alternatives provide an additional degree of design freedom. The second alternative also offers the advantage of simplicity because reflector 408 preferably comprises a metal such as gold, which has an extremely low etch rate.

The multi-spectral IR super-pixel photodetector 400 illustrated in FIGS. 5 and 6 includes four dual-band IR sub-pixel photodetectors 410, 420, 430 and 440. Each of the four dual-band IR sub-pixel photodetectors 410, 420, 430 and 440 forms a DROC that resonates at two different wavelengths for IR radiation incident on the multi-spectral IR super-pixel photodetector 400 from the top contact 102 side. Because the widths and periods for the elements of dual-band IR sub-pixels 410, 420, 430 and 440 are different, as seen most clearly in FIG. 6, they will each resonate at different wavelengths. The result is that multi-spectral IR super-pixel 400 will absorb IR radiation in a total of eight different bands. The two resonant wavelengths for each dual-band IR sub-pixel photodetector are controlled by several factors. The first factor is the period of the top contact elements 412a–c and 422a–c and the elongate IR absorbing layer elements 414a–c and 424a–c. The second factor is the width of the top contact elements 412a–c and 422a–c and the elongate IR absorbing layer elements 414a–c and 424a–c. The the third factor is the thickness of the top contact elements 412a–c and 422a–c, the elongate IR absorbing layer elements 414a–c and 424a–c, and the bottom contact 406. Lastly, the two resonant wavelengths are controlled by the material design of the top contact 102, the IR absorbing layer 104 and the bottom contact 106.

While the multi-spectral IR super-pixel photodetector 400 illustrated in FIGS. 5 and 6 includes four dual-band IR sub-pixel photodetectors 410, 420, 430 and 440 in a quadrant configuration, this is not required. The multi-spectral IR super-pixel photodetector can include four dual-band IR sub-pixel photodetectors in linear or offset configurations, for example. In addition, the multi-spectral IR super-pixel photodetector need not include four dual-band IR sub-pixel photodetectors. Embodiments may employ two or more dual-band IR sub-pixel photodetectors, though four are preferred. Furthermore, while the multi-spectral IR super-pixel photodetector 400, illustrated in FIGS. 5 and 6, includes a different DROC design for each dual-band IR sub-pixel photodetector 410, 420, 430 and 440, this is not required. Alternative embodiments may include two different DROC designs resulting in a "checkerboard" configuration.

Figure 7:
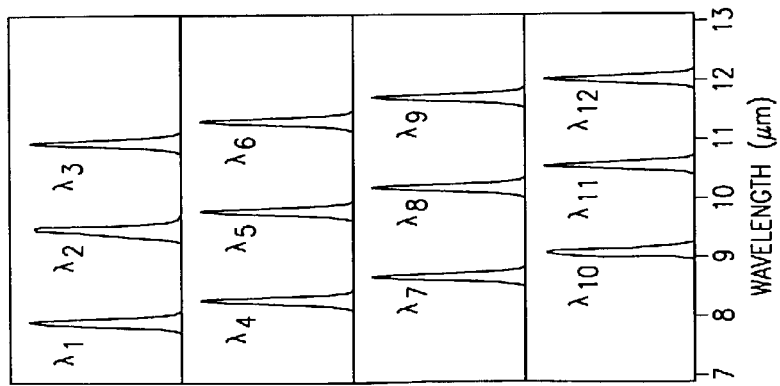
FIG. 7 is a predicted spectral response of the first embodiment of the present invention, FIGS. 8a,b are measured spectral responses of a multi-spectral IR sub-pixel photodetector.

The IR absorbing layer 104 will absorb in two rather broad IR bands. Each of these broad IR bands can be 1.5 µm or more in width, e.g., 8.3 to 9.8 µm, when operating in the LWIR. Depending upon the design of the DROC, the DROC's resonance may be as narrow as 0.5 µm. Therefore, by designing four DROCs with resonances spaced by 0.5 µm, the IR absorbing layer 104 can be forced to produce three or four bands of photoresponse in each of its two broad IR bands due to the different DROC designs. The net result is that the two original broad bands of IR absorption can be broken into as many as eight narrow bands of IR absorption. If the IR absorbing layer 104 includes three different well widths, then three broad bands of IR absorption will result leading to as many as twelve narrow bands of IR absorption as shown in FIG. 7.

It must be noted that, in contrast to conventional dual-band IR photodetectors, the IR radiation is incident on interleaved IR absorbing quantum wells or on the grouped longer wavelength IR absorbing quantum wells. In conventional dual-band IR photodetectors, if the IR radiation were incident on the longer wavelength IR absorbing layer, this longer wavelength IR absorbing layer would absorb the shorter wavelength IR radiation as well. This would result in significant cross-talk within the longer wavelength signal and little short wavelength signal. However, electromagnetic field modeling of the first embodiment shows the longer wavelength radiation generated high electric field regions closer to the top contact elements 412a–c and 422a–c corresponding to the longer wavelength absorbing material when the quantum wells are grouped rather than interleaved. Likewise, the shorter wavelength radiation generates high electric field regions closer to the bottom contact 406 corresponding to the shorter wavelength absorbing material when the quantum wells are grouped.

The removal of a portion of the IR absorbing layer 104 provides several advantages. By creating the DROCs, the photoresponse of the multi-spectral IR super-pixel photodetector 400 is enhanced as IR radiation of the appropriate wavelength resonates within the optical cavities of each dual-band IR sub-pixel photodetector 410, 42.0, 430 and 440, thereby increasing absorption. Thus, the optical cavities improve the signal generated or quantum efficiency of the multi-spectral IR super-pixel photodetector 400. Secondly, the generated dark current is reduced. The dark current is generated within the elongate IR absorbing layer elements 414a–c and 424a–c. By removing a significant portion of the IR absorbing layer 104, a reduction in dark current is observed. The dark current generates noise within the signal from each of the dual-band IR sub-pixel photodetectors 410, 420, 430 and 440. As this dark current induced noise is the primary source of noise under certain operating conditions, reducing the dark current is important to improving the sensitivity of the multi-spectral IR super-pixel photodetector 400. As the DROC increases quantum efficiency and reduces dark current and therefore noise, the multi-spectral IR super-pixel photodetector 400 has a higher signal to noise ratio or sensitivity when compared to other dual-band or multi-spectral IR photodetector technologies.

Figure 8A:
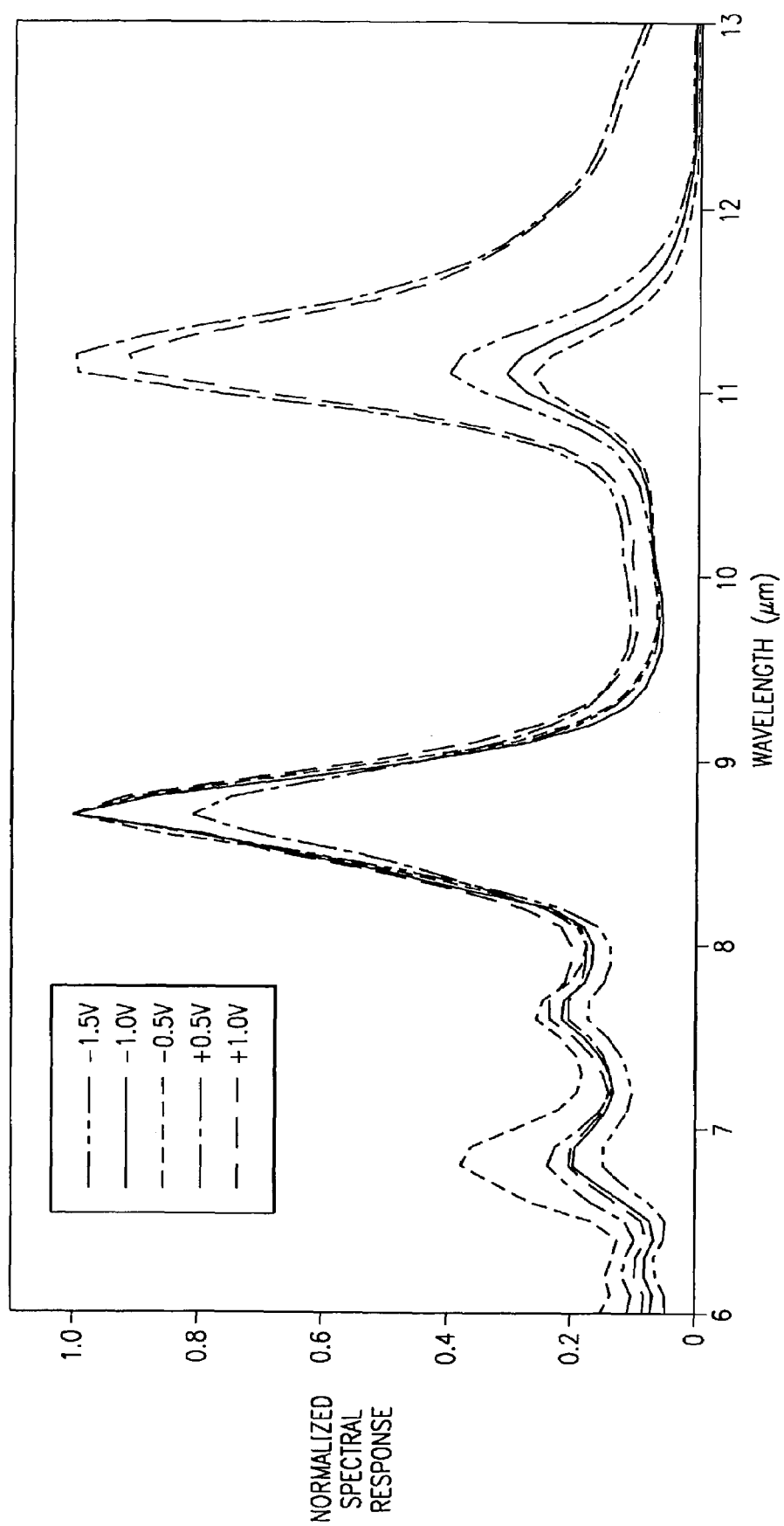
Figure 8B:
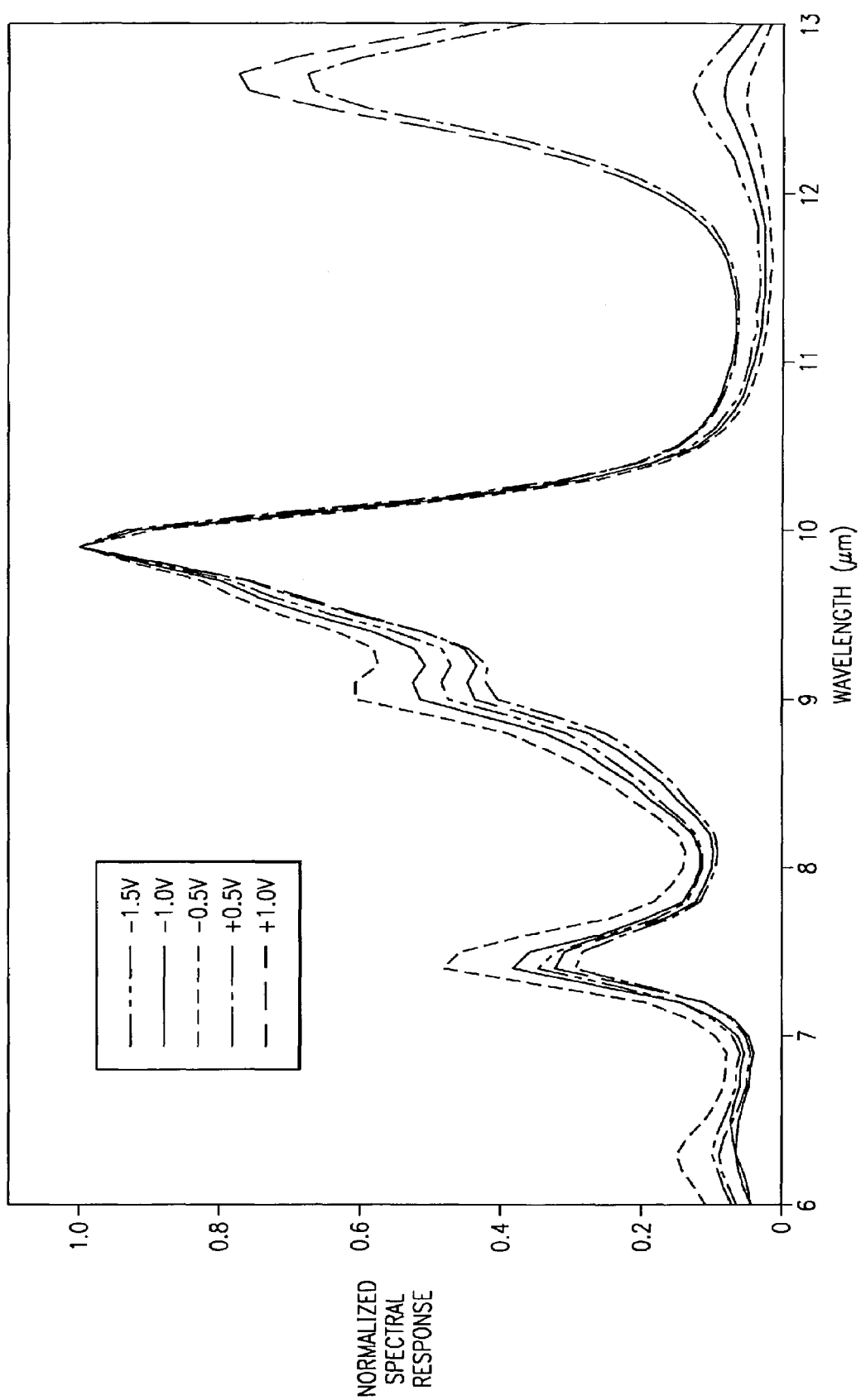

FIG. 8a shows the spectral response for a first dual-band IR sub-pixel photodetector made in accordance with the first embodiment. As can be seen, this first dual-band IR sub-pixel photodetector exhibits strong photoresponse in two narrow bands of LWIR radiation. Each of the response peaks is approximately 0.5 µm in width with the first band centered at 8.7 µm and the second band centered at 11.1 µm. The spectral response of a second dual-band IR sub-pixel photodetector adjacent the first but with a different width and period in its DROC design is shown in FIG. 8b. This design again results in 0.5 µm wide response peaks, but the two bands are centered at 9.9 µm and 12.7 µm.

The relative strength of the photoresponse for each of the two bands for the first dual-band IR sub-pixel photodetector is also clearly illustrated in FIG. 8a. For negative applied biases, the 8.7 µm band has a photoresponse approximately three times as large as the 11.1 µm band. For positive applied biases, the photoresponses are approximately equal. Therefore, the ratio of the photoresponse of the 8.7 µm band to the photoresponse of the 11.1 µm band is a relatively strong function of applied bias.

External electronics can be used to separate the photoresponses of the two bands for each dual-band IR sub-pixel photodetector due to their strong function of applied bias. By generating spectral response curves for the dual-band IR sub-pixel photodetector at two known applied biases, preferrably using a blackbody radiation source, the photoresponse due to radiation emitted by a target in each band can be readily calculated. These spectral response curves must be generated for each dual-band IR sub-pixel photodetector within a multi-spectral IR super-pixel photodetector. The photoresponse calculations generally correspond to two unknowns (the response to IR radiation at the two known applied biases) and two equations (the generated spectral response curve at each of the two biases), which can then be easily solved. Algorithms that are more complex may be desirable for even greater sensitivity. Preferably, the algorithm deconvolves the two measured responses using the generated spectral response curves at the two known biases. This deconvolution algorithm is especially preferable when three or more spectral response curves at three or more corresponding known biases are used. When only two bands of IR radiation are detected by the dual-band IR sub-pixel photodetector, the two known applied biases are preferably of opposite polarity. Note that the number of different applied biases must be equal to or greater than the number of infrared bands to be deconvolved. Therefore, a triple-band IR sub-pixel photodetector would require the application of at least three different biases.

Figure 9:
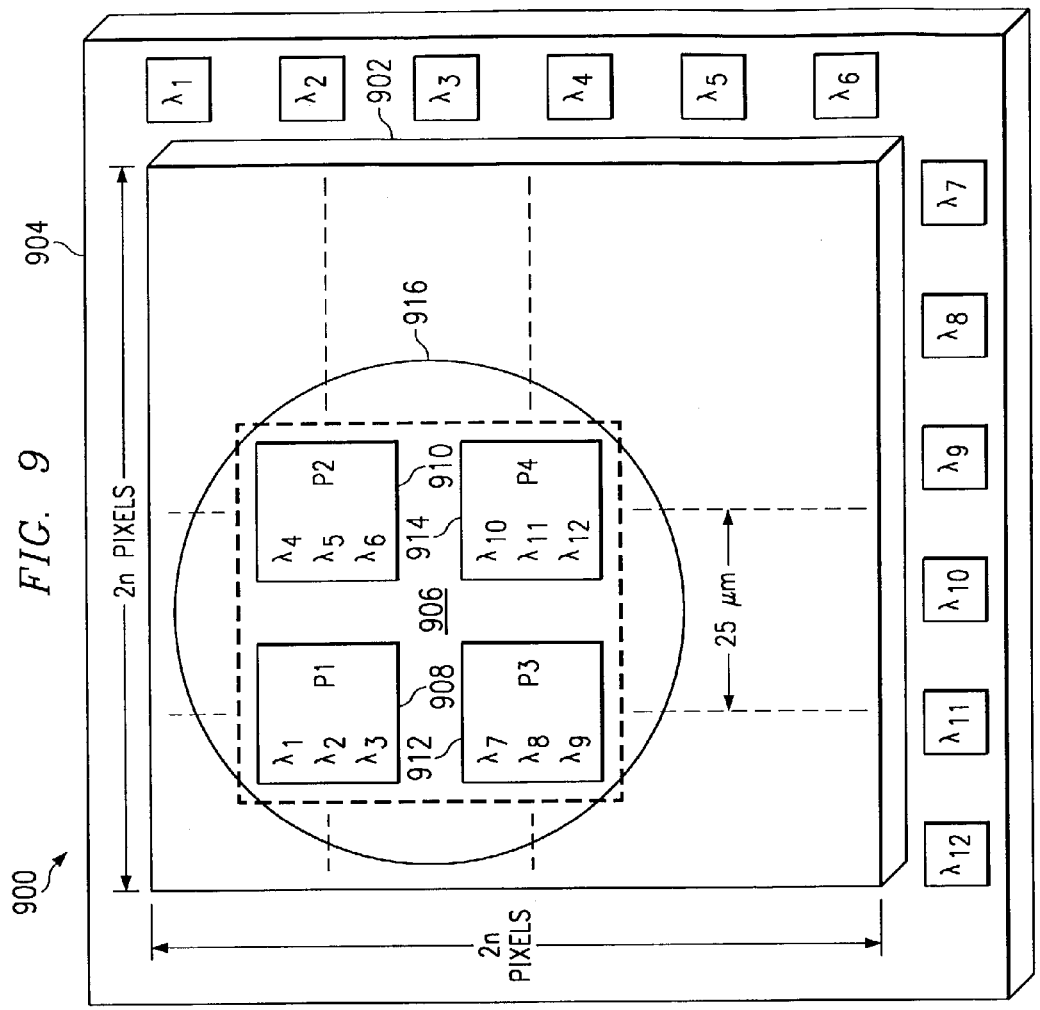
FIG. 9 is a top down view of the second embodiment of the present invention.

The external electronics used in conjunction with a single multi-spectral IR super-pixel photodetector or an array of multi-spectral IR super-pixel photodetectors in accordance with the first embodiment can be relatively complex. In a second embodiment of the present invention, an array of multi-spectral IR super-pixel photodetectors 902 is created for use in an imager 900 as illustrated in FIG. 9. A silicon readout integrated circuit 904 (ROIC) bonded to the array of multi-spectral IR super-pixel photodetectors 902 can be used to perform many of the required operating functions. The array of multi-spectral IR super-pixel photodetectors 902 is preferably formed by replicating the multi-spectral IR super-pixel photodetector 906 in both the X and Y directions. The multi-spectral IR super-pixel photodetector 906 of the illustrated embodiment includes four multi-spectral IR sub-pixel photodetectors 908, 910, 912 and 914. Each of the multi-spectral IR sub-pixel photodetectors 908, 910, 912 and 914 absorbs three different bands and thus the multi-spectral IR super-pixel photodetector 906 absorbs at a total of twelve different bands as shown in FIG. 7. While four multi-spectral IR sub-pixel photodetectors 908, 910, 912 and 914 are illustrated in this embodiment leading to twelve different bands, other combinations are possible. If the four multi-spectral IR sub-pixel photodetectors 908, 910, 912 and 914 responded to only two bands of IR radiation, then only eight different bands would be generated.

The ROIC 904 is preferably indium bump bonded to the array of multi-spectral IR super-pixel photodetectors 902 to provide electrical, thermal and mechanical connections. The ROIC 904 can be used to provide the three applied biases required for collecting the excited electrons from the array of multi-spectral IR super-pixel photodetectors 902 illustrated in this embodiment. These collected electrons will typically be used to charge a separate capacitor for each multi-spectral IR sub-pixel photodetector 908, 910, 912 and 914 for a given integration time, thereby producing a signal voltage. If space permits, a separate capacitor for each bias for each multi-spectral IR sub-pixel photodetector 908, 910, 912 and 914 is preferable. A separate capacitor for each bias for each multi-spectral IR sub-pixel photodetector 908, 910, 912 and 914 reduces the memory requirements for the ROIC.

Once a scene has been imaged for the integration time at each bias, the resulting signal voltages are deconvolved using stored spectral response curves. The stored spectral response curves are based upon the response of the multi-spectral IR sub-pixel photodetector 908, 910, 912 and 914 under the three applied biases, preferably when illuminated by blackbody radiation. Upon deconvolution, the signals for each of the three bands of each multi-spectral IR sub-pixel photodetector 908, 910, 912 and 914, i.e., signals from all twelve bands, can be multiplexed to an external system for further manipulation and/or display. While the above functions would preferably be performed by the ROIC, the ROIC may be limited to merely providing the three applied biases, integrating the charge and then multiplexing the resultant signal voltages to an external system. In this case, the external system would then deconvolve the signal voltages based upon the stored spectral response curves, thereby simplifying ROIC design.

It may appear that image quality would suffer for the imager 900 illustrated in FIG. 9, but this is not necessarily true. Due to the wavelength of the IR radiation and the optical focusing system placed in front of the imager 900, a blur circle 916 will result. That is, a small IR radiation source will have its image (IR radiation) spread across blur circle 916. For an f/2.5 optical focusing system operating at 10.0 μm, the blur circle 916 will have a diameter of 61 μm. As multi-spectral IR sub-pixel photodetectors 908, 910, 912 and 914 may be designed to have an edge length of 25 μm, the entire multi-spectral IR super-pixel photodetector 906 falls within the blur circle 916 as shown in FIG. 9. The result is that all twelve bands will be spatially registered, leading to high multi-spectral image quality.

The imager 900 could operate in two different modes. For an application requiring rapid detection of an object, the output from the bias resulting in the greatest sensitivity would be used. Alternatively, the sum of the signals at each bias could be used. Once the object had been detected, the imager 900 would be switched into an object identification mode. In this object identification mode, the infrared spectral emissions in all twelve bands would be detected by the imager 900. As many objects have distinctive thermal signatures, i.e., they do not emit the same amount of radiation at all wavelengths, the target could be identified. This object identification mode would require storing the thermal signatures of a number of possible objects to improve the likelihood of object identification. In an alternative embodiment, a multi-spectral IR sub-pixel photodetector that responds to only two bands of IR radiation is used and would lead to signals corresponding to only eight bands of IR radiation.

While the first embodiment was illustrated with equal periods in both the X and Y directions for each dual-band IR sub-pixel photodetector 410, 420, 430 and 440 as seen in FIG. 6, this need not be the case. For an application that requires broader spectral response in each IR band, a different period may be used in the X and Y directions. An initial design for dual-band IR sub-pixel photodetector 410 may have a period of 5.9 μm in both the X and Y directions. This leads to a dual-band IR sub-pixel photodetector having first and second band spectral response peaks at 8.7 μm and 11.2 μm respectively. By increasing the period in the Y direction by 24% relative to the period in the X direction, the first band spectral response could include resonances at 8.7 and 11.2 μm while the second band spectral response could include resonances at 9.9 and 12.7 μm. Thus, slightly varying the periodicity in the two perpendicular directions can broaden the spectral response, though the magnitude of the photoresponse will likely decrease.

The first embodiment was illustrated with the top contact elements 412*a–c* and 422*a–c* and the elongate IR absorbing elements 414*a–c* and 424*a–c* having equal widths for elements oriented in both the X and Y directions. This is not required. The use of different width top contact elements 412a–c and 422a–c and elongate IR absorbing elements 414a–c and 424a–c in the X direction relative to the Y direction provides an additional degree of freedom when designing the multi-spectral IR super-pixel photodetector 400.

Figure 10:
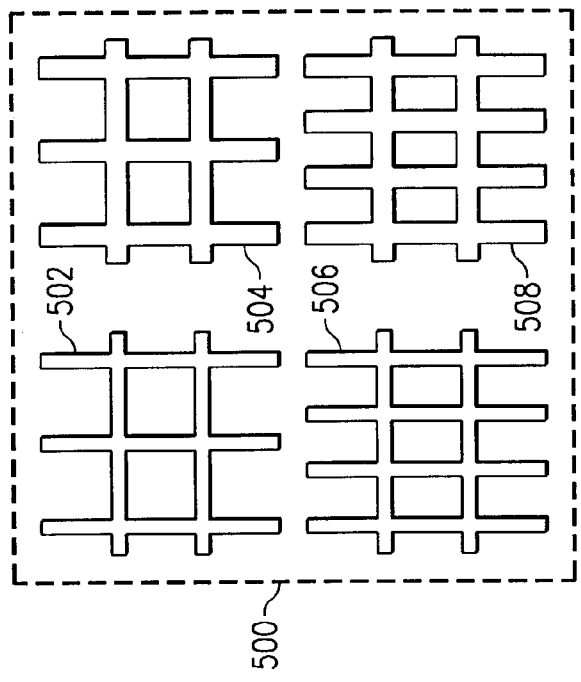
FIG. 10 is a top down view of the third embodiment of the present invention.

A multi-spectral IR super-pixel photodetector 500, according to a third embodiment of the present invention, is illustrated in FIG. 10. In the third embodiment, the periodicity in the X and Y directions for each dual-band IR sub-pixel photodetector 502, 504, 506 and 508 is different as seen in FIG. 10. The shorter wavelength band is more strongly diffracted by the DROC in the X direction (smaller period) while the longer wavelength band is more strongly diffracted by the DROC in the Y direction (greater period) for each dual-band IR sub-pixel photodetector 502, 504, 506 and 508. A dual-band IR sub-pixel photodetector 502, 504, 506 and 508 designed to respond in the MWIR and the LWIR could have a 3.0–4.0 μm period in the X direction while having a 7.0–8.0 μm period in the Y direction. The design process is simpler in the third embodiment as the periodicity and width in each direction can quickly be optimized through electromagnetic field modeling. Note, however, that truly optimized designs would presently require both electromagnetic field modeling and experimental results. As each wavelength band is most efficiently coupled in only one direction corresponding to one polarization, photoresponse corresponding to the second polarization is reduced. Thus, an engineering trade-off is required when selecting between the first and third embodiments.

Figure 11:
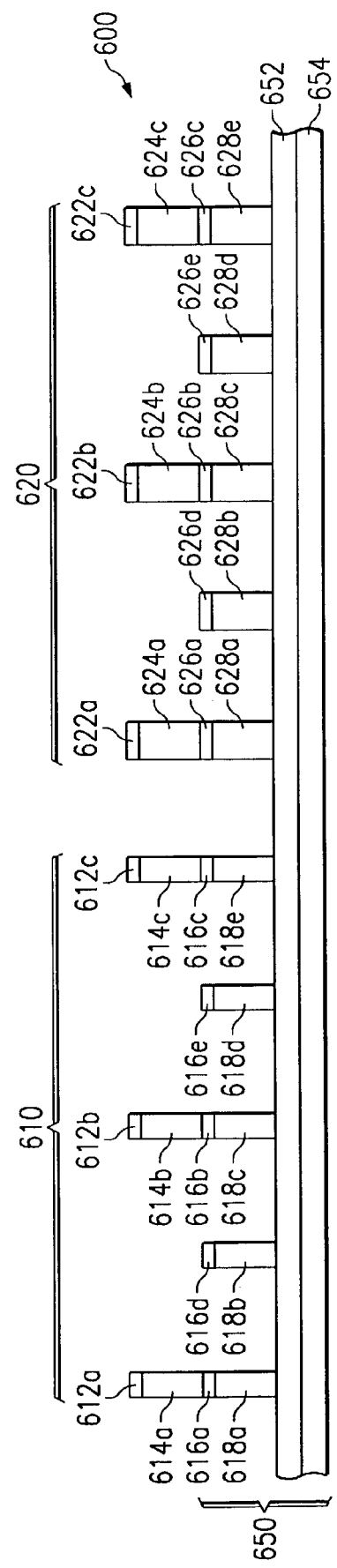
FIG. 11 is a cross-sectional view of a fourth embodiment.
Figure 12:
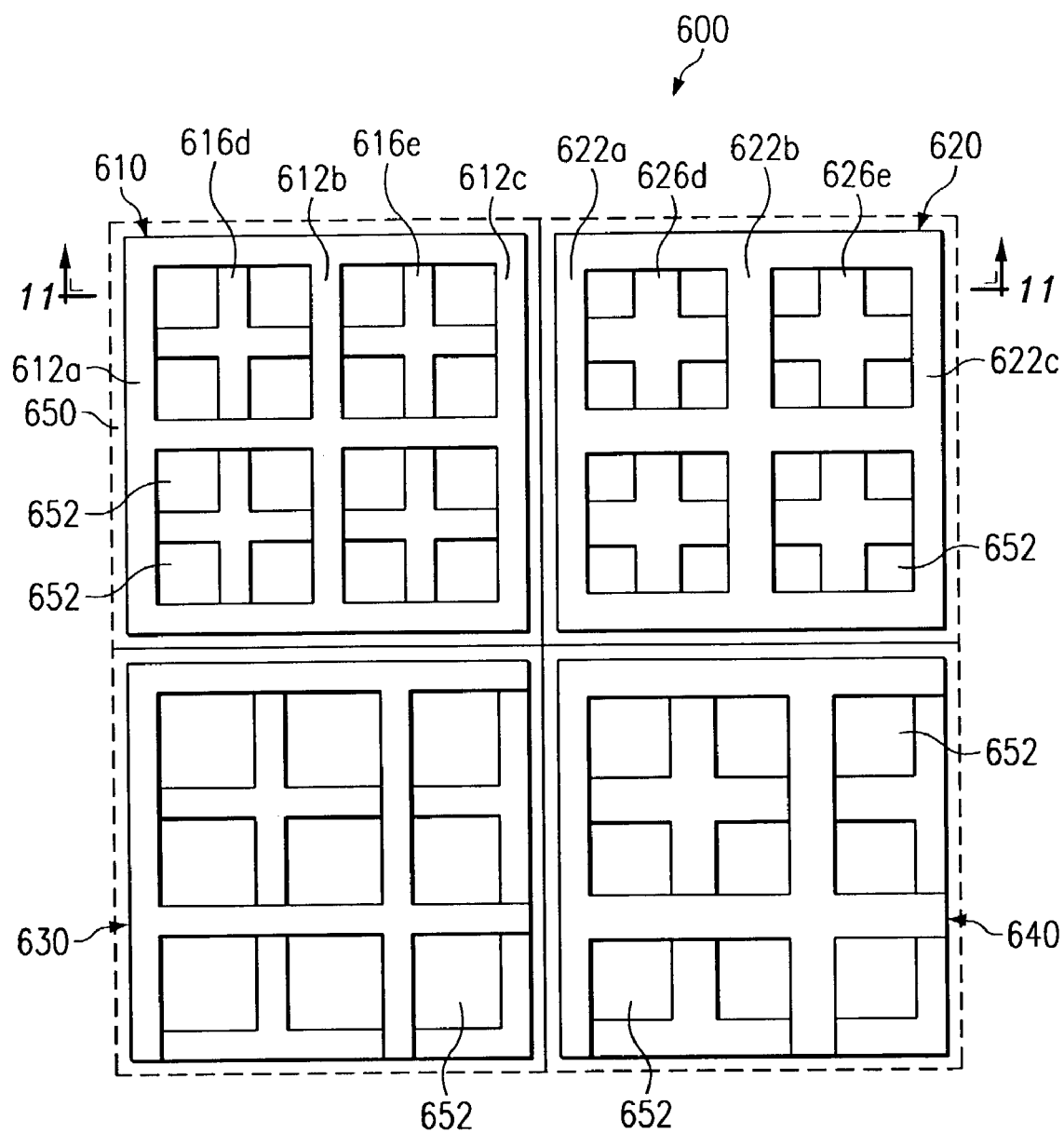
FIG. 12 is a top down view of the fourth embodiment.

In a fourth embodiment, shown in cross-sectional FIG. 11 a multi-spectral IR super-pixel photodetector 600 is designed with four small dual-band IR sub-pixel photodetectors 610, 620, 630 and 640 and one large IR sub-pixel photodetector 650. The four smaller dual-band IR sub-pixel photodetectors 610, 620, 630 and 640 preferably respond to various bands within the LWIR, while the large IR sub-pixel photodetector 650 preferably responds to one or more bands within the MWIR. As seen in FIG. 4, the multi-spectral IR super-pixel photodetector 600 forms a dual-level DROC with the upper level preferably designed for various bands within the LWIR, while the lower level is preferably designed for one or more bands within the MWIR and thus has a smaller period than the upper level. This is clearly shown in FIG. 12. The size of the multi-spectral IR super-pixel 600 and the large IR sub-pixel photodetector 650 is preferably 50 μm×50 μm, while each of the small dual-band IR sub-pixel photodetectors is preferably 25 μm×25 μm. Top contact elements 612a–c and 622a–c, top elongate IR absorbing layer elements 614a–c and 624a–c and middle contact elements 616a–c and 626a–c form part of a DROC that resonates at various LWIR bands. The middle contact elements 616a–e and 626a–e, bottom elongate IR absorbing layer elements 618a–e and 628a–e, bottom contact 652 and reflector 654 form part of the DROC that resonates at one or more MWIR bands. Both the top elongate IR absorbing layer elements 614a–c and 624a–c and the bottom elongate IR absorbing layer elements 618a–e and 628a–e are preferably formed of MQW material.

Figure 13:
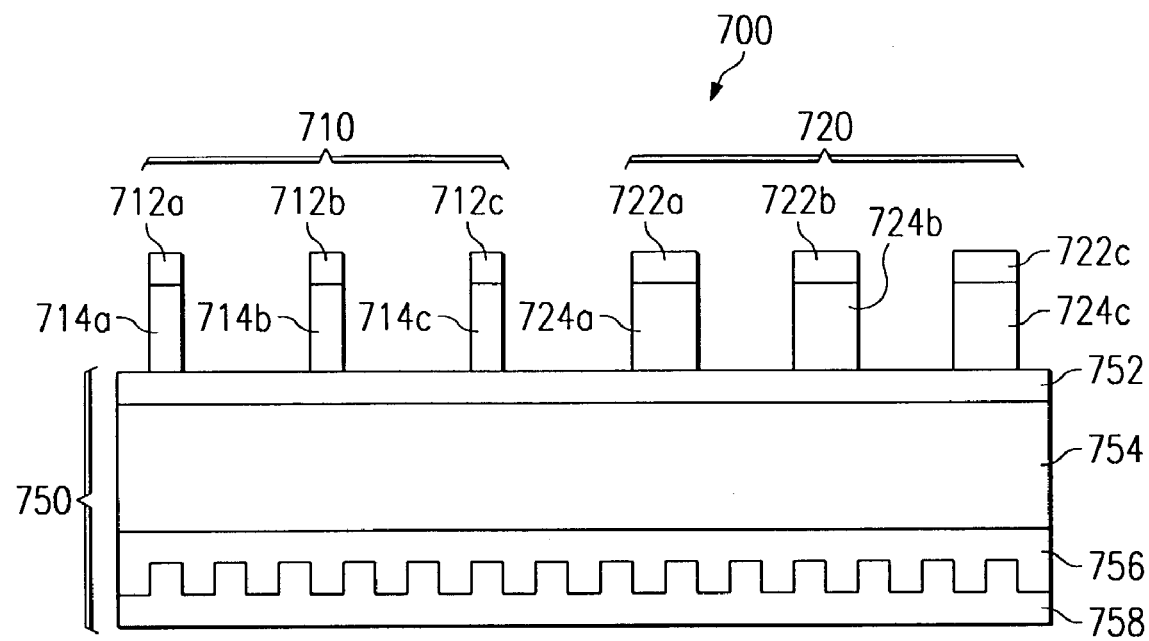
FIG. 13 is a cross-sectional view of a fifth embodiment.

Cross-sectional FIG. 13 shows a fifth embodiment multi-spectral IR super-pixel photodetector 700 that includes four small dual-band IR sub-pixel photodetectors 710, 720, 730 and 740 and one large IR sub-pixel photodetector 750, of which small dual-band IR sub-pixel photodetectors 730 and 740 are not illustrated. As with the fourth embodiment, the four small dual-band IR sub-pixel photodetectors 710, 720, 730 and 740 preferably respond to various bands within the LWIR, while large IR sub-pixel photodetector 750 preferably responds to one or more bands within the MWIR. The multi-spectral IR super-pixel photodetector 700 forms a DROC for the upper level (LWIR bands) and a standard grating coupled QWIP for the lower level (MWIR bands). In particular, top contact elements 712a–c and 722a–c, elongate IR absorbing layer elements 714a–c and 724a–c and middle contact layer 752 form part of a DROC that preferably resonates at various LWIR bands. The middle contact layer 752 is preferably a Bragg reflector for the various LWIR bands and transmits the one or more MWIR bands. Middle contact layer 752, planar IR absorbing layer 754, bottom contact layer 756 and grating reflector 758 form the standard QWIP. The grating reflector 758 is designed to diffract the one or more MWIR bands so that it can be absorbed by the MQWs in the planar IR absorbing layer 754. The grating reflector 758 can be formed by etching the appropriate grating pattern into the bottom contact layer 756 and then metalizing the resultant grating pattern as is known within the art.

Figure 14:
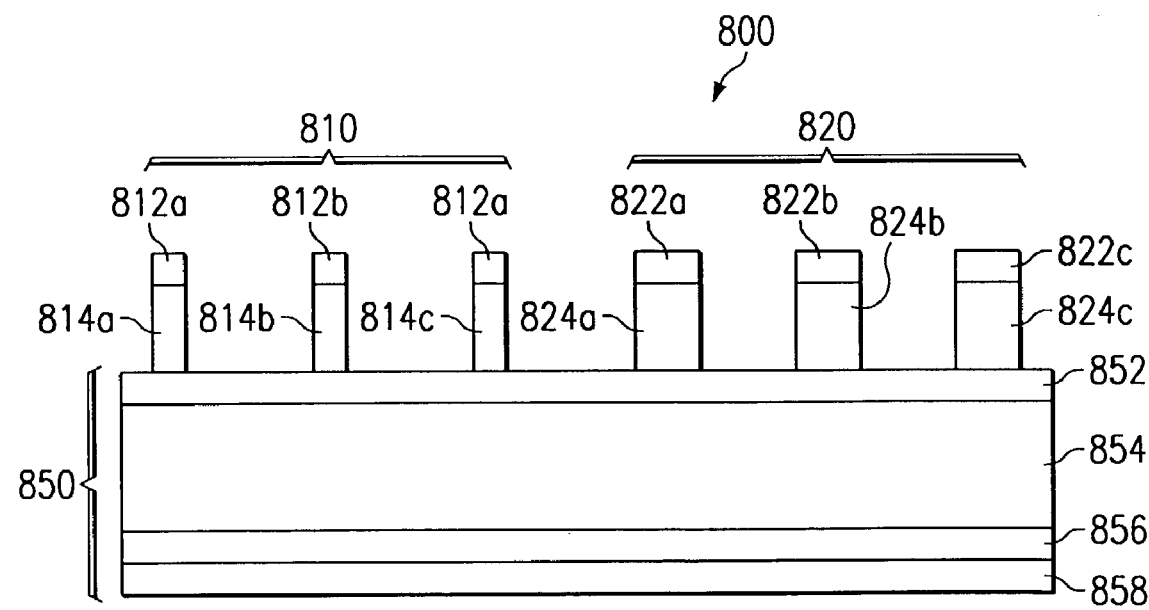
FIG. 14 is a cross-sectional view of a sixth embodiment.

Cross-sectional FIG. 14 shows a sixth embodiment multi-spectral IR super-pixel photodetector 800 that includes four small dual-band IR sub-pixel photodetectors 810, 820, 830 and 840 and one large IR sub-pixel photodetector 850, of which small dual-band IR sub-pixel photodetectors 830 and 840 are not illustrated. As with the fourth embodiment, the four small dual-band IR sub-pixel photodetectors 810, 820, 830 and 840 preferably respond to various bands within the LWIR. However, large IR sub-pixel photodetector 850 preferably responds to one or more bands within the short wavelength IR (SWIR), 1.0 μm to 3.0 μm. The multi-spectral IR super-pixel photodetector 800 forms a DROC for the upper level (LWIR bands) and a standard photodetector for the lower level (SWIR bands). In particular, top contact elements 812a–c and 822a–c, elongate IR absorbing layer elements 814a–c and 824a–c and middle contact layer 852 form part of a DROC that preferably resonates at various LWIR bands. The middle contact layer 852 is preferably a Bragg reflector for the various LWIR bands and transmits the one or more SWIR bands. Middle contact layer 852, planar IR absorbing layer 854, bottom contact layer 856 and reflector 858 form the standard photodetector. The thickness of the planar IR absorbing layer 854 and the bottom contact layer 856 is preferably a multiple of half of the desired SWIR wavelengths such that a vertical resonant cavity is formed to improved photodetector response. The fourth through sixth embodiments therefore allow for eight, twelve, or more LWIR bands and one or more MWIR or SWIR bands of detection. These additonal bands of detection provide for even greater flexibility with the present invention.

As indicated above, when using MQW material for the IR absorbing layer 104, the IR radiation must have an electric field component that is perpendicular to the plane of the quantum well. It has been found, both experimentally and through electromagnetic field modeling, that a DROC of the type found in the first through third embodiments is efficient at rotating the plane of electric field polarization of the incident IR radiation. This is important, as the incident IR radiation will typically be normally incident upon the multi-spectral IR super-pixel photodetector 400. The normally incident IR radiation will have its electric field polarized in the plane of the quantum well and thus little IR radiation would be absorbed. Therefore, use of the DROC design of the first through third embodiments is quite advantageous.

An important requirement of the present invention is a non-linear change in the spectral response of the IR absorbing layer 104 as a function of bias. If the output signal for the photodetector does not exhibit any spectral dependence upon applied bias, then the signal cannot be deconvolved to establish a signal for each of the two or more spectral bands. The underlying physics of the spectral bias dependence depends on at least the ground state electron population within the quantum wells and electron transport within the photodetector. The ground state electron population depends in part upon doping the quantum well with n-type dopants. Wider quantum wells, such as those required for shorter IR wavelength bands can more easily be doped to higher levels due to their width. The quantum well ground state electron population should be kept high to ensure electrons are present to absorb an incident IR photon. The refilling of the quantum well comes in part from the dark current within the photodetector. In the weakly coupled quantum wells of IR absorbing material 220, this dark current will tend to collect in the first quantum well encountered. That is, electrons that are transported through the barrier will most likely scatter into the first quantum well after the barrier. In FIG. 2*b*, this would correspond to scattering into quantum wells 222*a,b* under one polarity and quantum wells 224*a,b* under the opposite polarity. This is shown in FIGS. 8*a,b* where the response for a negative applied bias shows filling of the broader quantum well is favored, i.e., the shorter wavelength response is enhanced relative to positive applied bias.

Electron transport differences are pronounced when the quantum wells are grouped according to well width. Experiments have shown that at low biases, longer wavelength response is typically enhanced as little of the applied bias is dropped across the shorter wavelength group of quantum wells. With little applied bias being dropped across the shorter wavelength group of quantum wells, excited electrons are much more likely to scatter into the longer wavelength group of quantum wells. At higher biases, more of the applied bias is dropped across the shorter wavelength group of quantum wells and the excited carriers are more likely to be collected at the contact.

In the strongly coupled MQW material 240, the ground state electron populations are a function of bias. At certain applied biases, the ground states of the coupled quantum wells are at the same energy. This tends to equalize the response from the coupled quantum wells. At other biases, one or the other of the quantum wells will be lower and tend to have a majority of the ground state electrons leading to greater response for the higher populated quantum well. For BTB type material 340 using strongly coupled quantum wells, having the excited state in one quantum well aligned with either the ground state or the excited state of the other quantum well allows excited carriers to more readily tunnel out of the first quantum well and be collected at the contact. For these reasons, strongly coupled MQW material 240 exhibits a very strong bias dependence. This advantage is at least partially offset due to the generally larger dark current exhibited by strongly coupled MQW material 240.

Although the present invention has been fully described by way of examples with reference to the accompanying drawings, it is to be noted that various changes and modifications will be apparent to those skilled in the art. Therefore, such changes and modifications should be construed as being within the scope of the invention.

What is claimed is:

1. A multi-spectral infrared radiation super-pixel photodetector including a plurality of sub-pixel photodetectors, each of the plurality of sub-pixel photodetectors comprising:

a plurality of elements for absorbing at least two bands of infrared radiation, each of the plurality of elements being elongate, each of the plurality of elements having first and second opposite longitudinal surfaces, the at least two bands of infrared radiation incident upon the first surfaces of the plurality of elements;

a plurality of strips respectively being in electrical contact with and extending along the first surfaces of the plurality of elements, the plurality of strips being electrically interconnected;

a bottom contact being in electrical contact with the second surfaces of the plurality of elements, the plurality of strips and the bottom contact to provide for current flow through the plurality of elements in a direction substantially transverse to an axis of the plurality of elements; and a reflector for the at least two bands of infrared radiation, the reflector being disposed on an opposite longitudinal surface of the bottom contact from the plurality of elements, a bias voltage source, said bias voltage source selectively providing a plurality of external bias voltages, wherein a ratio between a photoresponse to each of the at least two bands of infrared radiation is a function of which of the plurality of external bias voltages is applied between the plurality of strips and the bottom contact, wherein the plurality of elements, the plurality of strips, the bottom contact and the reflector comprise a diffractive resonant optical cavity for the at least two bands of infrared radiation, and wherein a diffractive resonant optical cavity for a first sub-pixel photodetector of the plurality of sub-pixel photodetectors is different from a diffractive resonant optical cavity for a second sub-pixel photodetector of the plurality of sub-pixel photodetectors.

2. A multi-spectral infrared radiation super-pixel photodetector in accordance with claim 1, wherein the plurality of elements of each sub-pixel photodetector comprise multiple quantum well material selected from the group consisting of GaAs, AlGaAs, InGaAs, InP and combinations thereof.

3. A multi-spectral infrared radiation super-pixel photodetector in accordance with claim 1, wherein the reflector of each sub-pixel photodetector is either a metallic reflector or a Bragg reflector.

4. A multi-spectral infrared radiation super-pixel photodetector in accordance with claim 1, wherein the at least two bands of infrared radiation is two bands of infrared radiation.

5. A multi-spectral infrared radiation super-pixel photodetector in accordance with claim 1, wherein the at least two bands of infrared radiation is three bands of infrared radiation.

6. A multi-spectral infrared radiation super-pixel photodetector in accordance with claim 1, wherein a quantity of the plurality of sub-pixel photodetectors is two sub-pixel photodetectors.

7. A multi-spectral infrared radiation super-pixel photodetector in accordance with claim 1, wherein a quantity of the plurality of sub-pixel photodetectors is four sub-pixel photodetectors.

8. A multi-spectral infrared radiation super-pixel photodetector in accordance with claim 7, wherein a diffractive resonant optical cavity for a third sub-pixel photodetector is substantially the same as the diffractive resonant optical cavity of the first sub-pixel photodetector, and wherein a diffractive resonant optical cavity for a fourth sub-pixel photodetector is substantially the same as the diffractive resonant optical cavity of the second sub-pixel photodetector.

9. A multi-spectral infrared radiation super-pixel photodetector in accordance with claim 7, wherein a diffractive resonant optical cavity for each sub-pixel photodetector within the super-pixel photodetector is different.

10. A multi-spectral infrared radiation super-pixel photodetector in accordance with claim 7, wherein the four sub-pixel photodetectors are arranged in a linear configuration.

11. A multi-spectral infrared radiation super-pixel photodetector in accordance with claim 7, wherein the four sub-pixel photodetectors are arranged in a quadrant configuration.

12. A multi-spectral infrared radiation super-pixel photodetector including a plurality of sub-pixel photodetectors, each of the plurality of sub-pixel photodetectors comprising:
- a plurality of elements for absorbing at least two bands of infrared radiation, each of the plurality of elements being elongate, each of the plurality of elements having first and second opposite longitudinal surfaces, the at least two bands of infrared radiation incident upon the first surfaces of the plurality of elements;
- a plurality of strips respectively being in electrical contact with and extending along the first surfaces of the plurality of elements, the plurality of strips being electrically interconnected;
- a bottom contact being in electrical contact with the second surfaces of the plurality of elements, the plurality of strips and the bottom contact to provide for current flow through the plurality of elements in a direction substantially transverse to an axis of the plurality of elements; and
- a reflector for reflecting the at least two bands of infrared radiation, the reflector being disposed on an opposite longitudinal surface of the bottom contact from the plurality of elements,
- wherein the plurality of elements, the plurality of strips, the bottom contact and the reflector comprise a diffractive resonant optical cavity, the diffractive cavity having a first period in a first direction for diffracting a first band of the at least two bands of infrared radiation and a second period in a second direction for diffracting a second band of the at least two bands of infrared radiation, the second band of infrared radiation different from the first band of infrared radiation, the second direction being substantially perpendicular to the first direction,
- a bias voltage source, said bias voltage source selectively providing a plurality of external bias voltages, wherein a ratio between a photoresponse to each of the at least two bands of infrared radiation is a function of which of the plurality of external bias voltages is applied between the plurality of strips and the bottom contact, and
- wherein a diffractive resonant optical cavity for a first sub-pixel photodetector of the plurality of sub-pixel photodetectors is different from a diffractive resonant optical cavity for a second sub-pixel photodetector of the plurality of sub-pixel photodetectors.

13. A multi-spectral infrared radiation super-pixel photodetector in accordance with claim 12, wherein the plurality of elements of each sub-pixel photodetector comprise multiple quantum well material selected from the group consisting of GaAs, AlGaAs, InGaAs and combinations thereof.

14. A multi-spectral infrared radiation super-pixel photodetector in accordance with claim 12, wherein the reflector of each sub-pixel photodetector is either a metallic reflector or a Bragg reflector.

15. A multi-spectral infrared radiation super-pixel photodetector in accordance with claim 12, wherein the at least two bands of infrared radiation is two bands of infrared radiation.

16. A multi-spectral infrared radiation super-pixel photodetector in accordance with claim 12, wherein the at least two bands of infrared radiation is three bands of infrared radiation.

17. A multi-spectral infrared radiation super-pixel photodetector in accordance with claim 12, wherein a quantity of the plurality of sub-pixel photodetectors is two sub-pixel photodetectors.

18. A multi-spectral infrared radiation super-pixel photodetector in accordance with claim 12, wherein a quantity of the plurality of sub-pixel photodetectors is four sub-pixel photodetectors.

19. A multi-spectral infrared radiation super-pixel photodetector in accordance with claim 18,
- wherein a diffractive resonant optical cavity for a third sub-pixel photodetector is substantially the same as the diffractive resonant optical cavity of the first sub-pixel photodetector, and
- wherein a diffractive resonant optical cavity for a fourth sub-pixel photodetector is substantially the same as the diffractive resonant optical cavity of the second sub-pixel photodetector.

20. A multi-spectral infrared radiation super-pixel photodetector in accordance with claim 18, wherein a diffractive resonant optical cavity for each sub-pixel photodetector within the super-pixel is different.

21. A multi-spectral infrared radiation super-pixel photodetector in accordance with claim 18, wherein the four sub-pixel photodetectors are arranged in a linear configuration.

22. A multi-spectral infrared radiation super-pixel photodetector in accordance with claim 18, wherein the four sub-pixel photodetectors are arranged in a quadrant configuration.

23. A multi-spectral infrared radiation super-pixel photodetector including a plurality of sub-pixel photodetectors, each of the plurality of sub-pixel photodetectors comprising:
- a plurality of elements for absorbing three bands of infrared radiation, each of the three bands of infrared radiation being different from each of the other three bands of infrared radiation, each of the plurality of elements being elongate, each of the plurality of elements having first and second opposite longitudinal surfaces, the three bands of infrared radiation incident upon the first surfaces of the plurality of elements, the plurality of elements comprising multiple quantum well material including GaAs and AlGaAs;
- a plurality of strips respectively being in electrical contact with and extending along the first surfaces of the plurality of elements, the plurality of strips being electrically interconnected;
- a bottom contact being in electrical contact with the second surfaces of the plurality of elements, the plurality of strips and the bottom contact to provide for current flow through the plurality of elements in a direction substantially transverse to an axis of the plurality of elements; and a metallic reflector for the three bands of infrared radiation, the reflector being disposed on an opposite longitudinal surface of the bottom contact from the plurality of elements, a bias voltage source, said bias voltage source selectively providing a plurality of external bias voltages, wherein a ratio between a photoresponse to each of the three bands of infrared radiation is a function of which of the plurality of external bias voltages is applied between the plurality of strips and the bottom contact, wherein the plurality of elements, the plurality of strips, the bottom contact and the reflector comprise a diffractive resonant optical cavity for the three bands of infrared radiation, and wherein a diffractive resonant optical cavity for a first sub-pixel photodetector of the plurality of sub-pixel photodetectors is different from a diffractive resonant optical cavity for a second sub-pixel photodetector of the plurality of sub-pixel photodetectors.

24. A multi-spectral infrared radiation super-pixel photodetector including four upper sub-pixel photodetectors and one lower sub-pixel photodetector, each of the four upper sub-pixel photodetectors comprising:

a plurality of first elements for absorbing two or more bands of infrared radiation, each of the two or more bands of infrared radiation being different from each of the other two or more bands of infrared radiation, each of the plurality of first elements being elongate, each of the plurality of first elements having first and second opposite longitudinal surfaces, the two or more bands of infrared radiation incident upon the first surfaces of the plurality of first elements;

a plurality of strips respectively being in electrical contact with and extending along the first surfaces of the plurality of first elements, the plurality of strips being electrically interconnected;

a middle contact being in electrical contact with the second surfaces of the plurality of first elements, the plurality of strips and the middle contact to provide for current flow through the plurality of first elements in a direction substantially transverse to an axis of the plurality of first elements; and the one lower sub-pixel photodetector comprises:

one or more second elements for absorbing at least one band of infrared radiation, each of the one or more second elements having first and second opposite longitudinal surfaces, the at least one band of infrared radiation incident upon the first surfaces of the one or more second elements, the one or more second elements being disposed on an opposite longitudinal surface of the middle contact from the plurality of first elements of each of the four upper sub-pixel photodetectors;

a lower contact being in electrical contact with the second surfaces of the one or more second elements, the middle contact and the lower contact to provide for current flow through the one or more second elements in a direction substantially transverse to an axis of the one or more second elements; and a lower reflector for the at least one band of infrared radiation, the lower reflector being disposed on an opposite longitudinal surface of the lower contact from the one or more second elements, wherein a ratio between a photoresponse to each of the two or more bands of infrared radiation is a function of an external bias applied between the plurality of strips and the middle contact, wherein at least the plurality of first elements, the plurality of strips and the middle contact comprise a diffractive resonant optical cavity for the two or more bands of infrared radiation, wherein a diffractive resonant optical cavity for a first upper sub-pixel photodetector of the four upper sub-pixel photodetectors is different from a diffractive resonant optical cavity for a second upper sub-pixel photodetector of the four sub-pixel photodetectors, and wherein the four upper sub-pixel photodetectors are arranged in a quadrant configuration.

25. A multi-spectral infrared radiation super-pixel photodetector in accordance with claim 24, wherein the middle contact of each sub-pixel photodetector includes a Bragg reflector.

26. A multi-spectral infrared radiation super-pixel photodetector in accordance with claim 25, wherein the lower reflector is either a metallic reflector or a Bragg reflector.

27. A multi-spectral infrared radiation super-pixel photodetector in accordance with claim 25, wherein the lower reflector is a grating reflector for diffracting the at least one band of infrared radiation.

28. A multi-spectral infrared radiation super-pixel photodetector in accordance with claim 24:

wherein the one or more second elements are elongate, and wherein at least the middle contact, the one or more second elements, the lower contact and the lower reflector comprise a diffractive resonant optical cavity for the at least one band of infrared radiation.

29. A multi-spectral infrared radiation imager including a plurality of super-pixel photodetectors, each of the plurality of super-pixel photodetectors including a plurality of sub-pixel photodetectors, each of the sub-pixel photodetectors comprising:

a plurality of elements for absorbing at least two bands of infrared radiation, each of the plurality of elements being elongate, each of the plurality of elements having first and second opposite longitudinal surfaces, the at least two bands of infrared radiation incident upon the first surfaces of the plurality of elements;

a plurality of strips respectively being in electrical contact with and extending along the first surfaces of the plurality of elements, the plurality of strips being electrically interconnected;

a bottom contact being in electrical contact with the second surfaces of the plurality of elements, the plurality of strips and the bottom contact to provide for current flow through the plurality of elements in a direction substantially transverse to an axis of the plurality of elements; and a reflector for the at least two bands of infrared radiation, the reflector being disposed on an opposite longitudinal surface of the bottom contact from the plurality of elements, a bias voltage source, said bias voltage source selectively providing a plurality of external bias voltages, wherein a ratio between a photoresponse to each of the at least two bands of infrared radiation is a function of which of the plurality of external bias voltages is applied between the plurality of strips and the bottom contact, wherein the plurality of elements, the plurality of strips, the bottom contact and the reflector comprise a diffractive resonant optical cavity for the at least two bands of infrared radiation, and wherein a diffractive resonant optical cavity for a first sub-pixel photodetector of the plurality of sub-pixel photodetectors is different from a diffractive resonant optical cavity for a second sub-pixel photodetector of the plurality of sub-pixel photodetectors.

30. A multi-spectral infrared radiation imager in accordance with claim 29, wherein the plurality of elements of each sub-pixel photodetector comprise multiple quantum well material selected from the group consisting of GaAs, AlGaAs, InGaAs, InP and combinations thereof.

31. A multi-spectral infrared radiation imager in accordance with claim 29, wherein the reflector of each sub-pixel photodetector is either a metallic reflector or a Bragg reflector.

32. A multi-spectral infrared radiation imager in accordance with claim 29, wherein the multi-spectral infrared radiation imager is a one-dimensional multi-spectral infrared radiation imager.

33. A multi-spectral infrared radiation imager in accordance with claim 29, wherein the multi-spectral infrared radiation imager is a two-dimensional multi-spectral infrared radiation imager.

34. A multi-spectral infrared radiation imager in accordance with claim 29, wherein the at least two bands of infrared radiation is two bands of infrared radiation.

35. A multi-spectral infrared radiation imager in accordance with claim 29, wherein the at least two bands of infrared radiation is three bands of infrared radiation.

36. A multi-spectral infrared radiation imager in accordance with claim 29, wherein a quantity of the plurality of sub-pixel photodetectors is two sub-pixel photodetectors.

37. A multi-spectral infrared radiation imager in accordance with claim 29, wherein a quantity of the plurality of sub-pixel photodetectors is four sub-pixel photodetectors.

38. A multi-spectral infrared radiation imager in accordance with claim 37,
wherein a diffractive resonant optical cavity for a third sub-pixel photodetector is substantially the same as the diffractive resonant optical cavity of the first sub-pixel photodetector, and
wherein a diffractive resonant optical cavity for a fourth sub-pixel photodetector is substantially the same as the diffractive resonant optical cavity of the second sub-pixel photodetector.

39. A multi-spectral infrared radiation imager in accordance with claim 37, wherein a diffractive resonant optical cavity for each sub-pixel photodetector within each super-pixel photodetector of the plurality of super-pixel photodetectors is different.

40. A multi-spectral infrared radiation imager in accordance with claim 37, wherein the four sub-pixel photodetectors are arranged in a linear configuration.

41. A multi-spectral infrared radiation imager in accordance with claim 37, wherein the four sub-pixel photodetectors are arranged in a quadrant configuration.

42. A multi-spectral infrared radiation imager including a plurality of super-pixel photodetectors, each of the plurality of super-pixel photodetectors including a plurality of sub-pixel photodetectors, each of the plurality of sub-pixel photodetectors comprising:
a plurality of elements for absorbing at least two bands of infrared radiation, each of the plurality of elements being elongate, each of the plurality of elements having first and second opposite longitudinal surfaces, the at least two bands of infrared radiation incident upon the first surfaces of the plurality of elements;
a plurality of strips respectively being in electrical contact with and extending along the first surfaces of the plurality of elements, the plurality of strips being electrically interconnected;
a bottom contact being in electrical contact with the second surfaces of the plurality of elements, the plurality of strips and the bottom contact to provide for current flow through the plurality of elements in a direction substantially transverse to an axis of the plurality of elements; and
a reflector for reflecting the at least two bands of infrared radiation, the reflector being disposed on an opposite longitudinal surface of the bottom contact from the plurality of elements,
wherein the plurality of elements, the plurality of strips, the bottom contact and the reflector comprise a diffractive resonant optical cavity, the diffractive cavity having a first period in a first direction for diffracting a first band of infrared radiation of the at least two bands of infrared radiation and a second period in a second direction for diffracting a second band of infrared radiation of the at least two bands of infrared radiation, the second band of infrared radiation different from the first band of infrared radiation, the second direction being substantially perpendicular to the first direction,
a bias voltage source, said bias voltage source selectively providing a plurality of external bias voltages, wherein a ratio between a photoresponse to each of the at least two bands of infrared radiation is a function of which of the plurality of external bias voltages is applied between the plurality of strips and the bottom contact, and
wherein a diffractive resonant optical cavity for a first sub-pixel photodetector of the plurality of sub-pixel photodetectors is different from a diffractive resonant optical cavity for a second sub-pixel photodetector of the plurality of sub-pixel photodetectors.

43. A multi-spectral infrared radiation imager in accordance with claim 42, wherein the plurality of elements of each sub-pixel photodetector comprise multiple quantum well material selected from the group consisting of GaAs, AlGaAs, InGaAs and combinations thereof.

44. A multi-spectral infrared radiation imager in accordance with claim 42, wherein the reflector of each of the pixel structures is either a metallic reflector or a Bragg reflector.

45. A multi-spectral infrared radiation imager in accordance with claim 42, wherein the multi-spectral infrared radiation imager is a one-dimensional multi-spectral infrared radiation imager.

46. A multi-spectral infrared radiation imager in accordance with claim 42, wherein the multi-spectral infrared radiation imager is a two-dimensional multi-spectral infrared radiation imager.

47. A multi-spectral infrared radiation imager in accordance with claim 42, wherein the at least two bands of infrared radiation is two bands of infrared radiation.

48. A multi-spectral infrared radiation imager in accordance with claim 42, wherein the at least two bands of infrared radiation is three bands of infrared radiation.

49. A multi-spectral infrared radiation imager in accordance with claim 42, wherein a quantity of the plurality of sub-pixel photodetectors is two sub-pixel photodetectors.

50. A multi-spectral infrared radiation imager in accordance with claim 42, wherein a quantity of the plurality of sub-pixel photodetectors is four sub-pixel photodetectors.

51. A multi-spectral infrared radiation imager in accordance with claim 50,
   wherein a diffractive resonant optical cavity for a third sub-pixel photodetector is substantially the same as the diffractive resonant optical cavity of the first sub-pixel photodetector, and
   wherein a diffractive resonant optical cavity for a fourth sub-pixel photodetector is substantially the same as the diffractive resonant optical cavity of the second sub-pixel photodetector.

52. A multi-spectral infrared radiation imager in accordance with claim 50, wherein a diffractive resonant optical cavity for each sub-pixel photodetector within each super-pixel photodetector of the plurality of super-pixel photodetectors is different.

53. A multi-spectral infrared radiation imager in accordance with claim 50, wherein the four sub-pixel photodetectors are arranged in a linear configuration.

54. A multi-spectral infrared radiation imager in accordance with claim 50, wherein the four sub-pixel photodetectors are arranged in a quadrant configuration.

55. A multi-spectral infrared radiation imager comprising:
   a plurality of super-pixel photodetectors, each of the plurality of super-pixel photodetectors including four sub-pixel photodetectors, each of the sub-pixel photodetectors comprising:
   a plurality of elements for absorbing three bands of infrared radiation, each of the three bands of infrared radiation being different from each of the other three bands of infrared radiation, each of the plurality of elements being elongate, each of the plurality of elements having first and second opposite longitudinal surfaces, the three bands of infrared radiation incident upon the first surfaces of the plurality of elements, the plurality of elements comprising multiple quantum well material including GaAs and AlGaAs;
   a plurality of strips respectively being in electrical contact with and extending along the first surfaces of the plurality of elements, the plurality of strips being electrically interconnected;
   a bottom electrical contact being in electrical contact with the second surfaces of the plurality of elements, the plurality of strips and the bottom contact to provide for current flow through the plurality of elements in a direction substantially transverse to an axis of the plurality of elements; and
   a metallic reflector for the three bands of infrared radiation, the reflector being disposed on an opposite longitudinal surface of the bottom contact from the plurality of elements,
   a bias voltage source, said bias voltage source selectively providing a plurality of external bias voltages, wherein a ratio between a photoresponse to each of the three bands of infrared radiation is a function of which of the plurality of external bias voltages is applied between the plurality of strips and the bottom contact,
   wherein the plurality of elements, the plurality of strips, the bottom contact and the reflector comprise a diffractive resonant optical cavity for the three bands of infrared radiation, and
   wherein the diffractive resonant optical cavity for each of the four sub-pixel photodetectors within the super-pixel photodetector is different; and
   a readout integrated circuit, the readout integrated circuit for applying first, second and third external biases between the plurality of strips and the bottom contact of each of the sub-pixel photodetectors of each of the plurality of super-pixels thereby creating a corresponding photoresponse of each of the sub-pixel photodetectors of each of the plurality of super-pixel photodetectors, the readout integrated circuit for multiplexing the photoresponse of each of the sub-pixel photodetectors of each of the plurality of super-pixel photodetectors at each of the first, second and third external biases.

* * * * *